US006423799B1

(12) United States Patent
Berneth et al.

(10) Patent No.: US 6,423,799 B1
(45) Date of Patent: Jul. 23, 2002

(54) PHOTO-ADDRESSABLE SUBSTRATES AND PHOTO-ADDRESSABLE SIDE-GROUP POLYMERS WITH HIGHLY INDUCIBLE DOUBLE REFRACTION

(75) Inventors: Horst Berneth; Uwe Claussen, both of Leverkusen; Serguei Kostromine, Swisttal; Ralf Neigl, Leverkusen; Hans-Joachim Vedder, Puchheim, all of (DE)

(73) Assignee: Bayer AG (DE)

( * ) Notice: Subject to any disclaimer, the term of this patent is extended or adjusted under 35 U.S.C. 154(b) by 0 days.

(21) Appl. No.: 09/180,851

(22) PCT Filed: May 15, 1997

(86) PCT No.: PCT/EP97/02489

§ 371 (c)(1),
(2), (4) Date: Nov. 17, 1998

(87) PCT Pub. No.: WO97/44365

PCT Pub. Date: Nov. 27, 1997

(30) Foreign Application Priority Data

May 22, 1996 (DE) .......................................... 196 20 588
Jan. 29, 1997 (DE) .......................................... 197 03 132
Feb. 19, 1997 (DE) .......................................... 197 06 379

(51) Int. Cl.[7] ................................................ C08F 4/04
(52) U.S. Cl. ........................ 526/218.1; 430/19; 430/56; 430/270.1; 526/292.2; 526/292.3; 526/311; 526/312; 526/313; 526/298
(58) Field of Search ..................... 430/56, 276, 270.14; 526/218.1, 292.2, 292.3, 312, 313, 298, 311, 245

(56) References Cited

U.S. PATENT DOCUMENTS 4,631,328 A    12/1986  Ringsdorf et al.
4,925,589 A    5/1990   Lorenz
5,023,859 A    6/1991   Eich et al.
5,098,978 A    3/1992   Riepl et al.
5,190,689 A  * 3/1993   Finkelman et al. .... 252/299.01
5,262,081 A  * 11/1993  Gray et al. ............ 251/299.01
5,310,837 A    5/1994   May
5,496,670 A  * 3/1996   Hvilsted et al. ............... 430/56
5,543,267 A  * 8/1996   Stumpe et al. ............... 430/290
5,641,346 A  * 6/1997   Gray et al. ............... 526/292.2

FOREIGN PATENT DOCUMENTS

DE    39 20 420      1/1991
DE    42 08 328      9/1993
EP    090 282        2/1986
EP    322 708        7/1989
EP    333 022        9/1989
EP    335 302        10/1989
EP    538 773        4/1993
WO    93/03073       2/1993

* cited by examiner

Primary Examiner—David W. Wu
Assistant Examiner—Tanya Zalukaeva
(74) Attorney, Agent, or Firm—Connolly Bove Lodge & Hutz LLP

(57) ABSTRACT

Disclosed is an extremely rapidly photo-addressable storage media from inherently slow photo-addressable polymers by irradiating a substrate over a large area with a light source suitable for conventional inscription so that an optical anisotropy, i.e. a double refraction with a preferential direction in the plane of the substrate occurs. If the substrates so prepared are briefly intensively irradiated, the pattern is inscribed extremely rapidly and permanently. The invention also relates to novel side-chain polymers in which high optical anisotropy can be generated by irradiation. This optical anisotropy is very heat stable.

2 Claims, 5 Drawing Sheets

Figure 1:
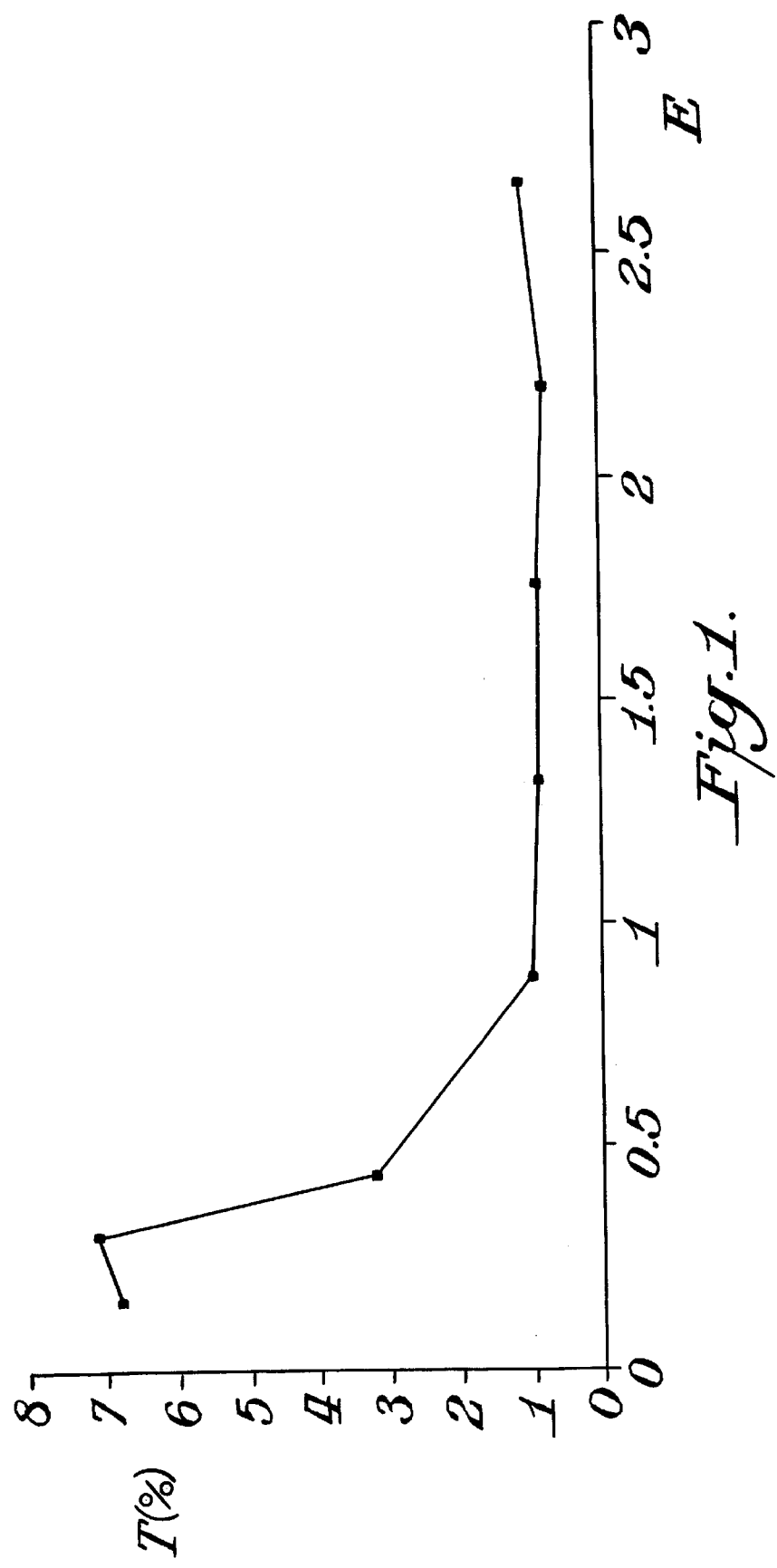

PHOTO-ADDRESSABLE SUBSTRATES AND PHOTO-ADDRESSABLE SIDE-GROUP POLYMERS WITH HIGHLY INDUCIBLE DOUBLE REFRACTION

The present invention relates to a process for the extremely rapid inscription of photo-addressable substrates, substrates prepared for this process, and the use of such substrates in information technology. The invention also relates to photo-addressable side-group polymers in which a high double refraction can be induced by irradiation, so that they are suitable for storing optically available information or for producing passive or optically switchable components.

Photo-addressable polymers are known (Polymers as Electrooptical and Photooptical Active Media, V. P. Shibaev (Editor), Springer Verlag, New York 1995). Particularly suitable for this purpose are side-group polymers, of which the group of copolymers is distinguished by a very wide range of possible variations of the properties. Their particular feature is that their optical properties such as absorption, emission, reflection, double refraction and scattering can be reversibly altered by light induction. Such polymers have a special branched structure: side groups that can absorb electromagnetic radiation and that are joined by parts of molecules acting as "spacers" are located on a linear backbone. Examples of this type are the side-group polymers containing azobenzene groups according to U.S. Pat. No. 5,173,381. These substances are characterised by the ability to exhibit double refraction in a specific direction when irradiated with polarised light. The inscribed double refraction patterns can be rendered visible in polarised light.

It is also known that a locally restricted double refraction whose preferred axis moves with the rotation of the direction of polarisation can be inscribed at an arbitrary position in layers of these polymers using polarised light (K. Anderle, R. Birenheide, M. Eich, J. H. Wendorff, Makromol. Chem., Rapid Commun. 10, 477–483 (1989), J. Stumpe, et al., 20. Freiburger Arbeitstagung Flüssigkristalle 1991). These processes are slow. Although in some cases the beginning of anisotropic behaviour can be detected already after a few seconds' exposure time, as a rule minutes and even hours are necessary in order for the effect to reach its achievable maximum. In this connection the magnitude of the effect is roughly proportional to the time employed. It is a particular feature of optical addressing that the optic axis of the inscribed double refraction is vertical to that of the inscribing polarised light. The simple possibility of being able optically to extinguish inscribed information by rotating the direction of polarisation of the inscribing light is based on this property. Inscription and extinction occur equally rapidly in this case; they are identical processes up to the direction of polarisation of the employed light. This is in contrast to the process of thermal extinction by heating the layer above the glass transition temperature of the polymer, in which all information is extinguished at once.

In data representation, storage and processing, two fundamentally different routes are followed, which may be termed serial and analog. In the analog route all data and information are simultaneously collected and converted. A typical example of this is photography using a silver halide film as an analog recording medium. This case involves exposure of a layer of photo-addressable polymers with polarised light through a master pattern. Since all image points are developed simultaneously, the inscription (development) time is seldom critical in these processes. With serial processes however the items of information are called up in succession. In the case of objects with a very high information density, for example images, potentially very large numbers of these image points have to be inscribed in succession, and the development time is thus the summation of the development times of the individual image points. For this reason a high inscription rate while maintaining a sufficient stability of both the initial state of the non-inscribed regions as well as of the final state of the inscribed regions is important. In both processes the accurate reproduction of gradations of differences in brightness (grey Stages) of the master pattern is also extremely important. Hitherto it has not been possible to solve in a technically satisfactory manner the problem of high inscription rates by the optical route, since in addition to the information transmission rate, further boundary conditions are essential. Such boundary conditions include in particular the stability, the extinguishability, and the ability to distinguish degrees of greyness. There are fundamental reasons for this.

As a general rule, only systems in which no mass but only fields or vectors are changed, can react extremely rapidly to control commands. If a mass is moved, for example in rearrangement processes or chemical reactions, the reaction is orders of magnitude slower and is governed also by the viscosity of the medium. For example, the switching time of the low-viscosity nematic rotational cells is at most in the region of msec, whereas a side-group copolymer takes minutes, often many hours, in order to reach the maximum achievable double refraction.

If the reversibility of the inscribed changes is dispensed with, then the energy density can be chosen arbitrarily and in the limiting case the substrate may be locally destroyed. Such materials are described for example by G. Kämpf in Kirk-Othmer, Encyclopaedia of Chemical Technology, 4th ed., 14, 277–338 (1995). This process, many variants of which are described in the literature, has some disadvantages however. The most important of these is that the process involves a considerable attack on the structure of the substrate, and the hole that is formed is basically unstable. In addition there is always the problem of the vaporised material, which may be deposited anywhere in the apparatus or on the storage medium, and finally very high laser energy densities are required, as a rule$>10^7$ mJ/m$^2$.

Since the preservation of the substrate is at the same time the necessary condition for its re-inscribability, the light intensity cannot be increased arbitrarily; instead, the intensity must remain below the decomposition threshold. The stability of the material thus defines the upper limit of the energy density. The smallest amount of energy that is necessary in order to produce a detectable and stable change in the layer has been measured by Coles (in a polysiloxane) as $4 \times 10^6$ mJ/m$^2$ (C.B. McArdle in Side Chain Liquid Crystal Polymers, Editor. C. B. McArdle, Blackie Publishers, Glasgow 1989, p. 374). Assuming that the minimum energy for polymeric substrates is of the same order of magnitude, it follows, if one wishes to treat the substrate gently, that the side-group polymers can only be inscribed slowly (since the minimum energy is already very close to the destruction energy), and accordingly such polymers are unsuitable for serial storage in real time. This principal disadvantage has up to now prevented the technical use of such polymers, and it is the object of the present invention to alleviate this defect.

We have now surprisingly found that extremely rapidly addressable storage media can be produced from the polymers that are slowly photo-addressable per se if the substrates are irradiated over a large area with a light source suitable for conventional inscription, so that an optical anisotropy is produced. Optical anisotropy means that the rate of propagation of the light in the plane of the layer is dependent on the direction. This produces direction-dependent refraction, so-called double refraction. If the suitably prepared substrates are irradiated for a short time with appropriately intensive light, the double refraction is varied extremely rapidly and permanently, i.e. is reduced or completely extinguished. The degree of residual double refraction can be adjusted according to the light intensity.

Two optical processes are thus involved, which differ in their action:

In a generative first process the layer must first of all become anisotropically double refractive over its area. The double refraction (optical anistropy) is conventionally expressed as the difference Δn of the maximum, direction-dependent refractive index n at a specific wavelength.

Any light source for polarised light, for example an incandescent lamp with a connected polariser foil or preferably a laser, is suitable for generating the large-area anisotropic double refraction. The required time depends substantially only on the power density of the light source, in which connection no lower limit for this is known at present. The upper limit of the power density of the light source is determined by the destruction threshold of the material, which depends on the material itself and is in the range from $10^7$ to $10^8$ mW/m$^2$. The material may be addressed over a large area in a structureless manner or selectively, for example through a mask, though structureless addressing is preferred, especially addressing that covers the whole area of the substrate. The optical anisotropy Δn of the first process that is necessary for the purposes of the invention may be very small; the only precondition is that it is still measurable. Preferably the anistropy Δn produced in the first process is at least 0.001, in particular at least 0.005; it is preferably at most 0.95, in particular at most 0.8.

The second optical process relates to the use of the substrates prepared in the first optical process and comprises addressing with light of very short duration the material made anisotropically double refractive. The inscribing light has a further quality however: it may be polarised or unpolarised. Polarised light is preferred whose axis lies parallel to that of the substrate. The energy density should as a rule be $10^3$ to $10^7$, preferably $10^5$ to $6 \times 10^6$ mJ/m$^2$. "Short time" means that the action of the light may last for $10^{-15}$ to $10^{-3}$, preferably $10^{-10}$ to $10^{-5}$ sec. The light source must be correspondingly quick, which means that laser light sources are preferred. With this method sequential inscription rates of up to 100 MHz, preferably 5 to 50 MHz, are possible. The sequential addressing means that although the absorption of the photon in the material takes place extremely rapidly, there is still sufficient time for a dark reaction.

Extinction may take place over a large area, with the result that an unstructured pattern is produced. Patterns with structures that have a diameter of 10 nm to 20 μm, in particular 10 nm to 1 μm, in the direction of their smallest extension are however preferred.

The inscribed information is stable, i.e. after the light source is switched off a storable double refraction pattern is obtained that can be read with the aid of polarised light. The change in brightness is proportional to the action of the light. The material is capable of grey gradations. The inscribed information is reversible, i.e. the information can be re-extinguished and then re-inscribed.

The invention accordingly provides the use of flat materials with an optical anisotropy Δn of 0.001 to 0.95 produced from photo-addressable polymers, for storing optically available information by partially selectively varying the optical anisotropy. A further subject of the invention is a process for storing patterns in the flat materials to be used according to the invention, by irradiating with light of an energy density of $10^3$ to $10^7$ mJ/m$^2$ for a duration of $10^{-3}$ to $10^{-15}$ sec.

The term "optically anisotropic" within the context of the invention means a difference Δn of the maximum, direction-dependent refractive index of at least 0.001 at a wavelength that is 30 nm shorter than the point at which the absorption in the long wavelength edge of the longest wavelength absorption maximum is still 1% (absorption maximum= 100%). Anisotropy values that are high as possible are desired, since they permit good results even at very low layer thicknesses. Preferred values of Δn are in the range from 0.05 to 0.95, in particular from 0.1 to 0.8.

The invention further provides polymers in which an optical anisotropy can be produced by pretreatment, and which can be varied by exposure for a period of $10^{-3}$ to $10^{-15}$ sec.

Suitable polymers for the production of the photo-addressable substrates are those in which a directed double refraction can be inscribed (Polymers as Electrooptical and Photooptical Active Media, V. P. Shibaev (Editor), Springer Verlag, New York 1995, Natansohn et al., Chem. Mater. 1993, 403–411). In particular these are side-group polymers, preference being given to the copolymers. Preferred examples of such copolymers are described for example in DE-OS 43 10 368 and 44 34 966. They preferably contain a poly(meth)acrylate main chain acting as backbone, with repeating units

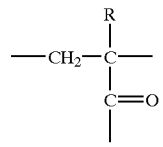

wherein R denotes hydrogen or methyl, the dots denote the coupling of the further units of the main chain, and the side chain is coupled to the carbonyl group.

The invention furthermore provides polymers with side chains having the structures described hereinafter.

The side chains branching from the main chain may correspond to the formulae

and

wherein $S^1$, $S^2$ denote independently of one another the atoms O, S or the radical $NR^1$, $R^1$ denotes hydrogen or $C_1$–$C_4$ alkyl, $T^1$, $T^2$ denote independently of one another the radical $(CH_2)_n$, which may optionally be interrupted by —O—, —$NR^1$— or —$OSiR^1_2O$—, and/or may be substituted by methyl or ethyl, n denotes the numbers 2, 3 or 4, $Q^1$, $Q^2$ denote a divalent radical, A denotes a unit that can adsorb electromagnetic radiation, and M denotes a polarisable aromatic group containing at least 12 π-electrons.

Particularly preferred are polymers in which
$Q^1$, $Q^2$ denote independently of one another $Z^1$, $Z^2$ or the group —$Z^1$—X—$Z^2$—, wherein $Z^1$, $Z^2$ denote independently of one another the groups —S—, —$SO_2$—, —O—, —COO—, —OCO—, —$CONR^1$—, —$NR^1CO$—, —$NR^1$—, —N=N—, —CH=CH—, —N=CH—, —CH=N— or the group —$(CH_2)_m$ where m=1 or 2, and X denotes a 5-membered or 6-membered cycloaliphatic, aromatic or heterocyclic ring, and in the case where $Z^1$=—COO— or —$CONR^1$— denotes a direct bond or the group —$(CH=CH)_m$—, m having the aforementioned meaning, A denotes the radical of a monoazo dye that absorbs in the wavelength range between 650 and 340 nm, and M denotes the radical of a polarised and further polarisable aromatic, linearly structured system with at least 12 π-electrons.

Preferred radicals A correspond to the formula

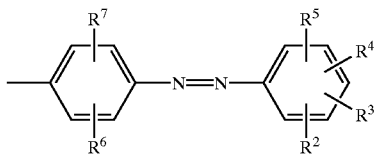

wherein $R^2$ to $R^7$ independently of one another denote hydrogen, hydroxyl, halogen, nitro, cyano, $C_1$–$C_4$ alkyl, $C_1$–$C_4$ alkoxy, $CF_3$, $CCl_3$, $CBr_3$, $SO_2CF_3$, $C_1$–$C_6$ alkysulfonyl, phenylsuphonyl, $C_1$–$C_6$ alkylaminosulfonyl, phenylaminosulfonyl, aminocarbonyl, $C_1$–$C_6$ alkylaminocarbonyl, phenylaminocarbonyl or $COOR^1$.

Preferred radicals M correspond to the formula

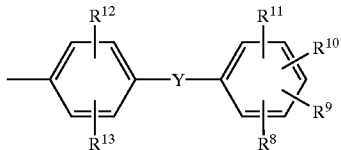

wherein $R^8$ to $R^{13}$ independently of one another denote hydrogen, hydroxyl, halogen, nitro, cyano, $C_1$–$C_4$ alkyl, $C_1$–$C_4$ alkoxy, $CF_3$, $CCl_3$, $CBr_3$, $SO_2CF_3$, $C_1$–$C_6$ alkysulfonyl, phenylsuphonyl, $C_1$–$C_6$ alkylaminosulfonyl, phenylaminosulfonyl, aminocarbonyl, $C_1$–$C_6$ alkylaminocarbonyl, phenylaminocarbonyl or $COOR^1$ and Y denotes —COO—, —OCO—, —CONH—, —NHCO—, —O—, —NH—, —N($CH_3$)— or a single bond.

Preferred are amorphous polymers, i.e. polymers that do not form macroscopically detectable liquid crystal phases. "Amorphous" denotes an optically isotropic state. Such polymers do not scatter visible light nor do they contain a double bond.

The compounds may be prepared in a manner known per se by copolymerising mesogene-containing and dye-containing monomers, by a polymer-type reaction or by polycondensation. Free-radical copolymerisation of the monomers is preferred, i.e. of the monomers with mesogenic groups on the one hand and dye-containing groups on the other hand, in suitable solvents, for example aromatic hydrocarbons such as toluene or xylene, aromatic halogenated hydrocarbons such as chlorobenzene, ethers such as tetrahydrofuran and dioxane, ketones such as acetone and cyclohexanone and/or amides such as dimethyl formamide, in the presence of conventional radical-donating polymerisation initiators, for example azodiisobutyronitrile or benzoyl peroxide, at elevated temperatures, for example at 30 to 130° C., preferably at 40 to 70° C., and as far as possible under the exclusion of moisture and air. Purification can be carried out by precipitating or dissolving and reprecipitating the resultant side-chain copolymers from their solutions, for example with methanol.

Whereas the groups that can absorb electromagnetic radiation as a rule absorb in the wavelength range of visible light, the mesogenic groups of side-group polymers that are known up to now have an absorption maximum at a substantially shorter wavelength, preferably at wavelengths of around 33000 cm$^{-1}$; the achievable double refraction changes are less than 0.1. The hitherto described processes for storing information by double refraction changes have usually been described as reversible, i.e. with a temperature rise produced by light or heat the stored information can be extinguished again; the use of light may offer the advantage of a locally restricted extinguishability, which is why this variant is sometimes preferred. The principal method of extinction by adding energy in the form of heat of course at the same time runs the risk of insufficient heat stability of the inscribed information; indeed, this is a disadvantage of the previously known prior art. Many compounds of this type thus have the disadvantage that the inscribed double refractions are not heatstable; at elevated temperatures, especially on approaching the glass transition temperature, the double refraction becomes weaker and finally disappears completely. Advantageous information carriers are accordingly those in which the stability of the inscribed information is as temperature insensitive as possible.

It has now been found that superior side-chain polymers are formed if the side chains are chosen so that their absorption maxima are at a specified distance from one another. In these new polymers information that is extremely heat stable can be inscribed using light.

The invention accordingly also provides polymers that carry side chains of different types on a main chain acting as a backbone, both of which can adsorb electromagnetic radiation (for one type at least, preferably of the wavelength of visible light), provided that the absorption maxima of the different side chains are at a distance of at least 200, preferably at least 500, and most 10,000, preferably at at most 9,000 cm$^1$, from one another.

Preferred polymers according to the invention carry on a main chain acting as a backbone covalently bonded side groups branching therefrom and having the formulae

and

wherein $S^1$, $S^2$ denote independently of one another oxygen, sulfur or $NR^1$, $R^1$ denotes hydrogen or $C_1$–$C_4$ alkyl, $T^1$, $T^2$ denote independently of one another the radical $(CH_2)_n$, which may optionally be interrupted by —O—, —$NR^1$— or —$OSiR^1{}_2O$—, and/or may optionally be substituted by methyl or ethyl, n denotes the numbers 2, 3 or 4, $Q^1$, $Q^2$ independently of one another denote a divalent radical, A, P independently of one another denote a unit that can adsorb electromagnetic radiation, with the proviso that the absorption maxima of the radicals $-Q^1-A$ and $-Q^2-P$ are at a distance of at least 200, preferably at least 500, and at most 10 000, preferably at most 9 000 cm$^{-1}$, from one another.

An essential feature of the invention is the recognition that the properties of the polymers according to the invention are better "if terminal groups $-Q^1-A$ and $-Q^1-P$ are more similar to each other." This applies in particular with respect to their electronic configuration. The agreement of the orbital symmetry of both groups should be large, but not 100%. By exciting the longer wavelength adsorbing group in the first excited electronic ($^1S_0$) state, the orbital symmetries of the groups A and P become approximately anti-symmetrical.

The function of the radicals $T^1$ and $T^2$ is to ensure a specific spacing of the side-group ends from the chain acting as the backbone. They are therefore also termed "spacers".

The radicals $Q^1$ and $Q^2$ join the terminal groups A and P to the spacers $T^1$ and $T^2$, which in turn form the bond to the main chain via the bonding member $S^1$ and $S^2$. The special feature of the groups $Q^1$ and $Q^2$ is their influence on both A and P on the one hand, as well as on $T^1$ and $T^2$ on the other hand. The radicals $Q^1$ and $Q^2$ are thus of quite special importance: for example, a similarity of the configuration, combined with a relatively similar position of the absorption maxima of $-Q^1-A$ and $-Q^2-P$, are for example achieved if identical radicals A and P are differently strongly polarised by different radicals $Q^1$ and $Q^2$.

Preferred radicals $Q^1$ and $Q^2$ contain independently of one another the groups $-S-$, $-SO_2-$, $-O-$, $-COO-$, $-OCO-$, $-CONR^1-$, $-NR^1CO-$, $-NR^1-$, $-(CH_2)_m-$ where m=1 or 2, a divalent 6-membered ring with optionally 1 to 2 N atoms (in which case the coupling to the radicals $T^1$ and A and to $T^2$ and P takes place via these N atoms) and the group $Z^1-X-Z^2$ wherein $Z^1$, $Z^2$ independently of one another denote the groups $-S-$, $-SO_2-$, $-O-$, $-COO-$, $-OCO-$, $-CONR^1-$, $-NR^1CO-$, $-NR^1-$, $-N=N-$, $-CH=CH-$, $-N=CH-$, $-CH=N-$ or the group $-(CH_2)_m-$ where m=1 or 2, and X denotes the naphthalene radical, a 5-membered or 6-membered cycloaliphatic, aromatic or heterocyclic ring, the group $-(CH=CH)_m-$ where m=1 or 2, or a direct bond.

Particularly preferred radicals X include 2,6-naphthylene and 1,4-phenylene, and heterocyclic radicals of the structures

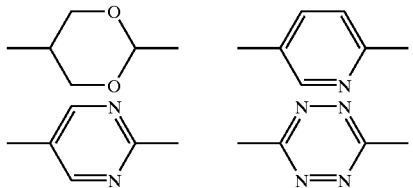

If X denotes a 5-membered ring system this may for example be a carbocyclic or, preferably, a heteroaromatic system and may contain up to 3 hetero atoms, preferably from the series S, N, O. Suitable representatives are for example thiophene, thiazole, oxazole, triazole, oxadiazole and thiadiazol. Heterocycles with 2 hetero atoms are particularly preferred.

If X denotes the group $-(CH=CH)_m-$, then m preferably has the value 1.

If X denotes a direct bond, the resultant compounds then are for example oxalic acid derivatives or urea derivatives, or carbamates (Z selected from $Z^1$ and $Z^2$).

The preferred meanings of $Z^1-X-Z^2$ are benzoic acid amide radicals and benzoic acid ester radicals of the type $-O-C_6H_4-COO-$, $-O-C_6H_4-CO-NR^1-$, $-NR^1-C_6H_4-COO-$, $-NR^1-C_6H_4-CO-NR^1-$, as well as fumaric acid ester and fumaric acid amide radicals of the type $-OCO-CH=CH-OCO-$ and $-NR^1-CO-CH=CH-CO-NR^1$.

$Q^1$ particularly preferably denotes the groups $-Z^1-C_6H_4-N=N-$ and $Q^2$ denotes the group $-Z^1-C_6H_4-CO-NH-$.

The groups $-Q^1-A$ should have absorption maxima in the wavelength range from 15000 to 28000 cm$^{-1}$, and the groups $-Q^2-P$ should have absorption maxima in the wavelength range from 16000 to 29000 cm$^{-1}$. For the purposes of the present invention A and P as well as $Q^1$ and $Q^2$ are defined so that the longer wavelength absorbing unit is termed $-Q^1-A$, while the shorter wavelength adsorbing unit is termed $-Q^2-P$.

Preferred radicals A and P include mononuclear and polynuclear radicals, for example cinnamic acid, biphenyl, stilbene and azo dye radicals, benzoic acid anilides or heterocyclic type analogues, preferably monoazo dye radicals.

Particularly preferred radicals A and P correspond to the formula

$$-E-N=N-G \qquad (III)$$

wherein

G denotes a monovalent aromatic or heterocyclic raadical and

E denotes a bivalent aromatic or heterocyclic radical.

In the case of E suitable aromatic radicals preferably contain 6 to 14 C atoms in the aromatic ring, which may be singly or multiply substituted by $C_1$–$C_{12}$ alkyl, $C_1$–$C_{12}$ alkoxy, hydroxy, halogen (in particular F, Cl, Br), amino, nitro, trifluoromethyl, cyano, carboxy, COOR (R=$C_1$–$C_6$ alkyl, cyclohexyl, benzyl, phenyl), $C_5$–$C_{12}$ cycloalkyl, $C_1$–$C_{12}$ alkylthio, $C_1$–$C_6$ alkylsulfonyl, $C_6$–$C_{12}$ arylsulfonyl, aminosulfonyl, $C_1$–$C_6$ alkylaminosulfonyl, phenylaminosulfonyl, aminocarbonyl, $C_1$–$C_6$ alkylaminocarbonyl, phenylaminocarbonyl, $C_1$–$C_4$ alkylamino, di-$C_1$–$C_4$ alkylamino, phenylamino, $C_1$–$C_5$ acylamino, $C_1$–$C_4$ alkylsulfonylamino, mono- or di-$C_1$–$C_4$ alkylaminocarbonylamino, $C_1$–$C_4$ alkoxycarbonylamino or trifluoromethylsulfonyl.

In the case of E suitable heterocyclic radicals preferably contain 5 to 14 ring atoms, of which 1 to 4 hetero atoms are from the series nitrogen, oxygen, sulfur, the heterocyclic ring system being able to be singly or multiply substituted by $C_1$–$C_{12}$ alkyl, $C_1$–$C_{12}$ alkoxy, hydroxy, halogen (in particular F, Cl, Br), amino, nitro, trifluoromethyl, cyano, carboxy, COOR (R=$C_1$–$C_6$ alkyl, cyclohexyl, benzyl, phenyl), $C_5$–$C_{12}$ cycloalkyl, $C_1$–$C_{12}$ alkylthio, $C_1$–$C_6$ alkylsulfonyl, $C_6$–$C_{12}$ arylsulfonyl, aminosulfonyl, $C_1$–$C_6$ alkylaminosulfonyl, phenylaminosulfonyl, aminocarbonyl, $C_1$–$C_6$ alkylaminocarbonyl, phenylaminocarbonyl, $C_1$–$C_4$ alkylamino, di-$C_1$–$C_4$ alkylamino, phenylamino, $C_1$–$C_5$ acylamino, $C_1$–$C_4$ alkylsulfonylamino, mono- or di-$C_1$–$C_4$ alkylaminocarbonylamino, $C_1$–$C_4$ alkoxycarbonylamino or trifluoromethylsulfonyl.

In the case of G suitable aromatic radicals preferably contain 6 to 14 C atoms in the aromatic ring, which may be singly or multiply substituted by $C_1-C_{12}$ alkyl, $C_1-C_{12}$ alkoxy, hydroxy, halogen (in particular F, Cl, Br), amino, nitro, trifluoromethyl, cyano, carboxy, COOR (R=$C_1-C_6$ alkyl, cyclohexyl, benzyl, phenyl), $C_5-C_{12}$ cycloalkyl, $C_1-C_{12}$alkylthio, $C_1-C_6$alkylsulfonyl, $C_6-C_{12}$ arylsulfonyl, aminosulfonyl, $C_1-C_6$ alkylaminosulfonyl, phenylaminosulfonyl, aminocarbonyl, $C_1-C_6$ alkylaminocarbonyl, phenylaminocarbonyl, $C_1-C_4$ alkylamino, di-$C_1-C_4$ alkylamino, phenylamino, $C_1-C_5$ acylamino, $C_6-C_{10}$ arylcarbonylamino, pyridylcarbonylamino, $C_1-C_4$ alkylsulfonylamino, $C_6-C_{12}$ arylsulfonylamino, mono or di-$C_1-C_4$ alkylaminocarbonyl-amino, $C_1-C_4$ alkoxycarbonylamino or trifluoromethylsulfonyl.

In the case of G suitable heterocyclic radicals preferably contain 5 to 14 ring atoms, of which 1 to 4 hetero atoms are from the series nitrogen, oxygen, sulfur, the heterocyclic ring system being able to be singly or multiply substituted by $C_1-C_{12}$ alkyl, $C_1-C_{12}$ alkoxy, hydroxy, halogen (in particular F, Cl, Br), amino, nitro, trifluoromethyl, cyano, carboxy, COOR (R=$C_1-C_6$ alkyl, cyclohexyl, benzyl, phenyl), $C_5-C_{12}$ cycloalkyl, $C_1-C_{12}$ alkylthio, $C_1-C_6$ alkylsulfonyl, $C_6-C_{12}$ arylsulfonyl, aminosulfonyl, $C_1-C_6$ alkylaminosulfonyl, phenylaminosulfonyl, aminocarbonyl, $C_1-C_6$ alkylaminocarbonyl, phenylaminocarbonyl, $C_1-C_4$ alkylamino, di-$C_1-C_4$ alkylamino, phenylamino, $C_1-C_5$ acylamino, $C_1-C_4$ alkylsulfonylamino, mono- or di-$C_1-C_4$ alkylaminocarbonylamino, $C_1-C_4$ alkoxycarbonylamino or trifluoromethylsulfonyl.

If the radicals E or G are multiply substituted, the number of substituents is governed in each case by the number of possible substitution positions, the possibility of incorporating the substituents, and the properties of the substituted systems. The aryl and acyl radicals may optionally be substituted by nitro, cyano, halogen, $C_1-C_4$ alkoxy or amino.

Particularly preferred radicals —E—N=N—G contain either an aromatic radical and a heterocyclic radical (i.e. either E or G are aromatic, the other radical being heterocyclic), or two aromatic radicals (i.e. both E and G are aromatic).

The preferred radicals —E—N=N—G are azobenzene radicals of the formula

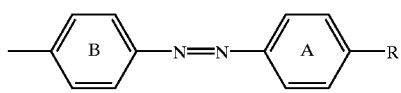

(IV)

wherein

R denotes nitro, cyano, benzamido, p-chloro, p-cyano, p-nitrobenzamido or dimethylamino, and the rings A and B may additionally be substituted. Particularly preferred radicals A and P correspond go the formula

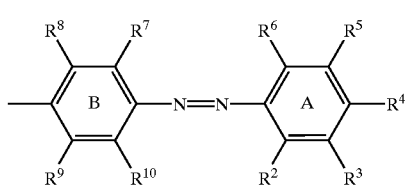

(V)

wherein $R^2$ to $R^6$ independently of one another denote hydrogen, chlorine, bromine, trifluoromethyl, methoxy, $SO_2CH_3$, $SO_2CF_3$, $SO_2NH_2$, $N(CH_3)_2$, preferably nitro, cyano or p-chloro, p-cyano, p-nitrobenzamido, with the proviso that at least one of these radicals is not hydrogen, and $R^7$ to $R^{10}$ independently of one another denote hydrogen, chlorine or methyl.

In the case of multiple substitution of the ring A, the 2,4- and 3,4-positions are preferred.

Other preferred radicals A and P correspond to the formula:

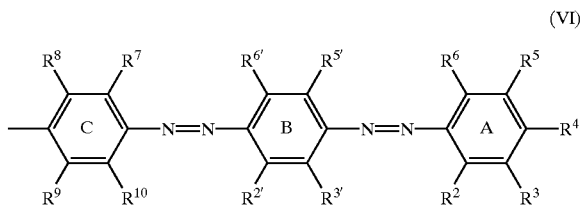

(VI)

wherein $R^2$ to $R^6$ and $R^7$ to $R^{10}$ have the aforementioned meanings, and $R^{2'}$ to $R^{6'}$ have the same meanings as $R^2$ to $R^6$, although independently of the latter.

Other preferred radicals A and P correspond to the formula

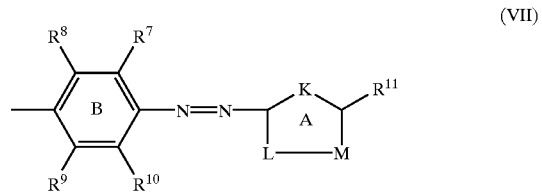

(VII)

wherein

K, L, M independently of one another denote the atoms N, S, O or optionally —$CH_2$— or —CH=, with the proviso that at least one of the members K, L, M is a hetero atom and the ring A is saturated or contains 1 or 2 double bonds, and $R^7$ to $R^{11}$ independently of one another have the meanings specified above for $R^7$ to $R^{10}$.

The ring A preferably denotes a thiophene, thiazole, oxazole, triazole, oxadiazole or thiadiazole radical.

Preferred radicals —$Q^1$—A and —$Q^2$—P correspond to the formulae

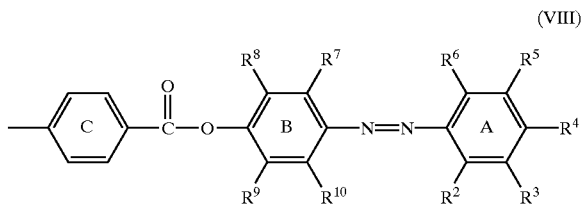

(VIII)

or

-continued (IX)

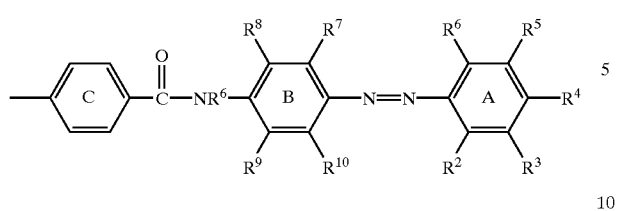

wherein $R^1$ to $R^{10}$ have the meanings specified above.

Preferred groups A and P correspond to the formulae (X)

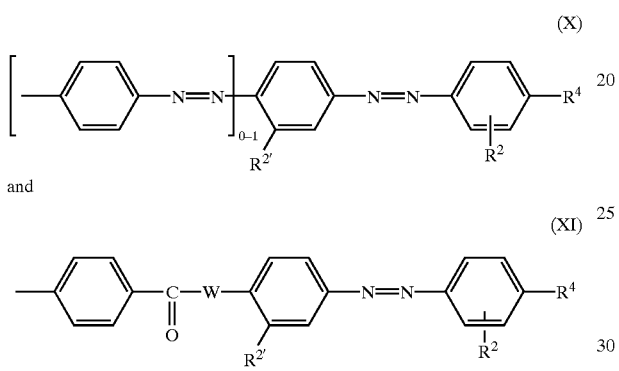

and (XI)

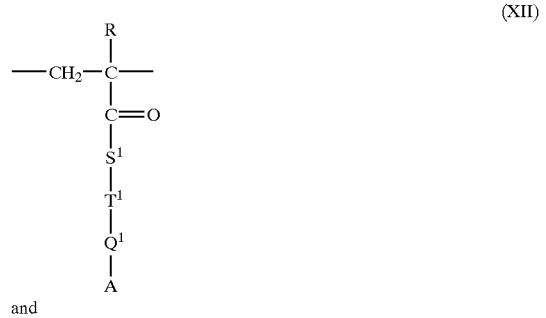

wherein $R^2$ denotes hydrogen or cyano, $R^{2'}$ denotes hydrogen or methyl,

W denotes oxygen or $NR^1$, and $R^4$ denotes nitro, cyano, benzamido, p-chloro, p-cyano, p-nitrobenzamido or dimethylamino.

Common to the above formulae is the fact that substitutions in the 4-, 2,4- and 3,4-positions of the ring A are particularly preferred.

For these preferred groups A and P, preferred groups —$S^1$—$T^1$—$Q^1$— and —$S^2$—$T^2$—$Q^2$ — correspond to the formulae —$OCH_2CH_2O$—, —$OCH_2CH_2OCH_2CH_2O$— and —$OCH_2CH_2NR^1$—.

The preferred polymers according to the invention contain only repeating units with the side groups I and II, and more particularly preferably those of the formulae (XII)

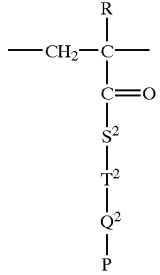

and

-continued (XIII)

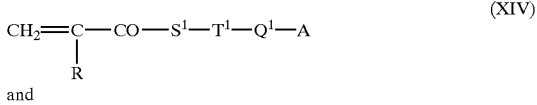

where R=H or, preferably, methyl.

The corresponding preferred monomers for introducing the side groups I and II thus correspond to the formulae $$CH_2{=}C{-}CO{-}S^1{-}T^1{-}Q^1{-}A \quad \text{(XIV)}$$
$$\quad\quad\;|\;$$
$$\quad\quad\;R$$

and $$CH_2{=}C{-}CO{-}S^2{-}T^2{-}Q^2{-}P \quad \text{(XV)}$$
$$\quad\quad\;|\;$$
$$\quad\quad\;R$$

The side groups (I) and (II) are thus preferably joined to (meth)acryloyl groups $CH_2{=}C(R){-}CO{-}$ where R=hydrogen or methyl.

Preferably the main chain of the side-group polymers is formed from monomers that carry the side groups (I), from monomers that carry the side group (II), and optionally from further monomers, in which connection in particular the proportion of the monomers that exhibit the side group (I) is 10 to 95 mole %, preferably 20 to 70 mole %, the proportion of the monomers that exhibit the side group (II) is 5 to 90 mole %, preferably 30 to 80 mole %, and the proportion of the further monomers is 0 to 50 mole %, in each case referred to the sum of all incorporated monomer units.

As "further" repeating units, all basic building blocks which can be incorporated chemically into the side-group polymer are suitable. They substantially serve simply to reduce the concentration of the side groups I and II in the polymer and thus produce, as it were, a "dilution" effect. In the case of poly(meth)acrylates the "further" monomer include ethylenically unsaturated copolymerisable monomers that preferably carry α-substituted vinyl groups or β-substituted alkyl groups, preferably styrene; however, also suitable are for example nuclear-chlorinated and alkylated or alkenylated styrenes, the alkyl groups being able to contain 1 to 4 carbon atoms and the alkenyl groups being able to contain 2 to 4 carbon atoms, for example vinyl toluene, divinyl benzene, α-methyl styrene, tert.-butyl styrenes, chlorinated styrenes; vinyl esters or carboxylic acids with 2 to 6 carbon atoms, preferably vinyl acetate, vinyl pyridine, vinyl naphthalene, vinyl cyclohexane, acrylic acid and methacrylic acid and/or their esters (preferably vinyl, allyl and methallyl esters) with 1 to 4 carbon atoms in the alcohol component, their amides and nitrites, maleic anhydride, maleic acid semi-esters and dyesters with 1 to 4 carbon atoms in the alcohol component, maleic acid semi-amides and diamides and cyclic imides such as N-methyl maleimide or N-cyclohexyl maleimide, allyl compounds such as allyl benzene and allyl esters such as allyl acetate, phthalic acid diallyl esters, isophthalic acid diallyl esters, fumaric acid diallyl esters, allyl carbonates, diallyl carbonates, triallyl phosphate and triallyl cyanurate.

Preferred "further" monomers correspond to the formula

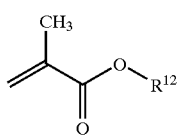

(XVI)

wherein $R^{12}$ denotes an optionally branched $C_1$–$C_6$ alkyl radical or a radical containing at least one further acrylic radical.

The polymers according to the invention may also contain more than one side group that falls under the definition of (I), or more than one side group that falls under the definition of (IIa) and (IIb), or several side groups that fall under the definition of both (I) and (IIa) and (IIb).

The polymers according to the invention preferably have glass transition temperatures Tg of at least 40° C. The glass transition temperature may be determined for example according to B. Vollmer, Grundriβ der Makromolekularen Chemie (Foundations of Macromolecular Chemistry), pp. 406 to 410, Springer-Verlag, Heidelberg 1962).

The polymers according to the invention generally have a weight average molecular weight of 3000 to 2000000, preferably 5000 to 1500000, as determined by gel permeation chromatography (calibrated with polystyrene).

Structural elements with a high dimensional anisotropy and high molecular polarisability anisotropy are the prerequisite for high values of the optical anisotropy. By means of the structure of the polymers the intermolecular interactions of the structural elements (I) and (IIa) and (IIb) are adjusted so that the formation of liquid crystal order states is suppressed, and optically isotropic, transparent non-scattering films can be produced. On the other hand the intermolecular interactions must nevertheless be strong enough so that, on irradiation with polarised light, a photochemically induced, co-operative, directed re-orientation process of the side groups is effected.

In the optically isotropic, amorphous polymers according to the invention extremely high values of the optical anisotropy can be induced by irradiation with polarised light. The measured values of the change in double refraction Δn are between 0.05 and 0.8.

As light there is preferably used linearly polarised light whose wavelength lies in the range of the absorption bands of the side groups.

The present invention also provides polymers in which double refraction changes Δn of more than 0.15, preferably more than 0.2, and in particular more than 0.4, can be inscribed using polarised light. The value Δn should be measured as described hereinafter:

First of all in each case the absorption maxima $\lambda_{max1}$ and $\lambda_{max2}$ are measured in both homopolymers. A double refraction change is produced by irradiating a film of the copolymer to be tested using linearly polarised light of a wavelength of $(\lambda_{max1}+\lambda_{max2}):2$. For this purpose the samples are irradiated with polarised light in the direction of the normal to the surface. The output of the light source should be 1000 mW/cm$^2$; in the case that the copolymer is destroyed under these conditions, the output of the light source is reduced in 100 mW steps until the copolymer is no longer destroyed by the irradiation. The irradiation is continued until the double refraction no longer changes. The double refraction change that is produced is measured with a selective wavelength of $[(\lambda_{max1}+\lambda_{max2}):2]+350\pm50$ [nm]. The polarisation of the measuring light should form an angle of 45° relative to the direction of polarisation of the inscribing light.

The preparation of the side-group monomers and their polymerisation can be carried out according to processes known in the literature; see for example Makromolekulare Chemie 187, 1327–1334 (1984), SU 887 574, Europ. Polym. 18, 561 (1982) and Liq. Cryst. 2, 195 (1987), DD 276 297, DE-OS 28 31 909 and 38 08 430. The polymers according to the invention are generally prepared by free-radical copolymerisation of the monomers in suitable solvents, for example aromatic hydrocarbons such as toluene or xylene, aromatic halogenated hydrocarbons such as chlorobenzene, ethers such as tetrahydrofuran or dioxane, ketones such as acetone or cyclohexanone, and/or dimethyl formamide in the presence of radical-donating polymerisation initiators, for example azobis(isobutyronitrile) or benzoyl peroxide, at elevated temperatures, generally at 30 to 130° C., preferably at 40 to 70° C., with exclusion of water and air as far as possible. Isolation can be carried out by precipitation with suitable agents, for example methanol. The products can be purified by re-precipitation, for example with chloroform/methanol.

The present invention thus also provides a process for preparing the side-group polymers by copolymerisation of the corresponding monomers.

The polymers are processed into layers whose thickness is 0.1 to 500 μm, preferably 1 to 30 μm, particularly preferably 2 to 10 μm. They can be cast from solution, applied with a knife, dipped, or spin coated. They can form self-supporting films. Preferably however they are applied to supporting materials. This can be effected by various techniques known per se, the process being selected according to whether a thick or thin layer is desired. Thin layers may be produced for example by spin coating or knife application from solutions or the melt, while thicker layers may be produced by melt pressing or extrusion.

It is possible successfully to produce isotropic films without the need for time-consuming and costly orientation processes using external fields and/or surface effects. The films can be applied to substrates by spin coating, immersion, casting or other technologically easily controllable coating processes, introduced between two transparent plates by pressing or inflow, or can simply be produced as self-supporting films by casting or extrusion. Such films can also be produced from liquid-crystal polymers that contain the structural elements in the aforedescribed sense, by sudden cooling, i.e. at a cooling rate of>100 K/min, or by rapidly draining off the solvent.

The invention therefore also provides films (both self-supporting and in the form of coatings) formed from the aforedescribed polymers, as well as supports coated with these films.

The side-group polymers according to the invention are optically isotropic, amorphous, transparent and non-light-scattering in the glassy state of the polymers and can form self-supporting films.

Preferably however they are applied to supporting materials, for example glass or plastics films. This can be effected by various techniques known per se, the particular process being chosen according to whether a thick or thin film is desired. Thin films can be produced for example by spin coating or knife application from solutions or from the melt, while thicker films can be produced by filling prepared cells, or by melt pressing or extrusion.

The polymers can be used for digital or analog data storage in the widest sense, for example for optical signal processing, for Fourier transforms and folding or in coherent optical correlation techniques. The lateral resolution is limited by the wavelength of the inscribing light, and permits a pixel size of 0.45 to 3000 μm, preferably a pixel size of 0.5 to 30 μm.

This property makes the polymers particularly suitable for processing images and for information processing by means of holograms, which can be reproduced by illuminating with a reference beam. Similarly, the interference pattern can store two monochromatic coherent light sources with constant phase relation. Accordingly, three-dimensional holographic images can be stored. The images are read by illuminating the hologram with monochromatic, coherent light. On account of the relationship between the electrical vector of the light and the associated preferred direction in the storage medium, a higher storage density can be achieved than with a purely binary system. With analog storage values of the grey scale can be adjusted continuously and locally resolved. Information that is stored in an analog manner can be read in polarised light, and the positive or the negative image can be created depending on the position of the polarisers. In this connection the contrast of the film produced by the phase displacement of the ordinary and extraordinary beam between two polarisers can be utilised, the planes of the polariser advantageously forming an angle of 45° relative to the plane of polarisation of the inscribing light, and the plane of polarisation of the analyser being either at right angles or parallel to that of the polariser. Another possibility is to detect the angle of deflection of the reading light produced by induced double refraction.

The polymers can be used as optical components that can be passive or can be actively switched, in particular for holographic optics. The high light-induced optical anisotropy can thus be used for the electrical modulation of the intensity and/or polarisation state of light. Accordingly, components can be produced from a polymer film by holographic structuring that have image-forming properties comparable to lenses or gratings.

The layers can be used for the serial recording of light-transmitting data of all types, especially of images in the medical sector.

The invention therefore also provides for the use of the optically anisotropic substrates in information technology, especially as structural elements and components for storing and processing information, preferably images, and as holographic recording material.

The percentage figures in the following examples refer, unless otherwise stated, in each case to parts by weight.

EXAMPLES

Example 1

1.1 Pre-exposure

Glass plates of size 2×2 cm were spin coated with a solution of the polymer with repeating units of the following formulae:

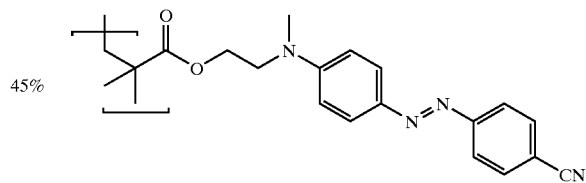

-continued

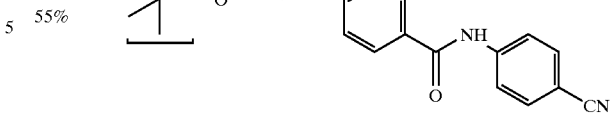

In order to achieve as homogeneous a pre-exposure as possible, the plates were pre-exposed (from a distance of 2 cm) on a commercially available light box (Planilux, Type LJ-S, light source: 2 light tubes (each of output 15 Watt) connected up to a foil polariser) following which the transmission values were measured between two crossed polarisers. 7.6% transmission was obtained after 1 hour's pre-exposure, and 13.7% after 2 hours' pre-exposure.

1.2 Inscription and measuring arrangement

An arrangement consisting of a linearly polarised He-Ne laser connected to an expansion optics system, sample holder, rotatable polarisation filter as well as an Ulbricht sphere with a connected photocell powermeter is used to measure the inscribed double refraction. The inscribed samples are aligned relative to the polarisation direction of the He-Ne laser so that the angle relative to the polarisation direction of the inscribing laser is 45°. The transmitting direction of the polarisation filter is at right angles to the direction of the sampling He-Ne laser. In this configuration the transmitted laser power is measured as a function of the inscribing power on the corresponding sample field. An additional measurement of the transmitting power at a non-inscribing sample site in the "open" position of the polarisation filter serves for normalisation.

1.3 Inscription

Flat surfaces (flat fields) are inscribed using the aforedescribed recorder arrangement. The polarisation direction of the inscribing laser was at right angles to the transmitting direction of the foil polariser us ed for the pre-exposure. The relevant data of the inscribing arrangement are as follows:

| Laser source: Ar-ion laser, linearly polarised. Single line operation, $\lambda = 514.5$ nm | |
|---|---|
| Laser power in the plane of the image | max 280 mW |
| Laser spot size | 7–8 $\mu$m |
| Pixel size (line spacing) | 5.4 $\mu$m |
| Scanning length | 7.41 mm |
| Scanning height | 5.82 mm |
| Scanning speed (in the line direction) | 0.6 to 23.8 m/sec |

The illumination energy in the plane of the image is determined by the laser power in the plane of the image as well as by the scanning speed.

The following change in transmission is obtained according to the energy of the inscribing light (scanning speed 23.8 m/sec; T=sample transmission in %, E=inscribing energy in [$10^6$ mJ/m$^2$]) (see FIG. 1).

The following characteristic data can be derived from the measurement data:

| | |
|---|---|
| Total density stroke in the inscribing region | $\delta D = 0.9$ |
| Gradation in the "linear" part of the curve | $g = 1.9$ |
| Energy density to achieve $\delta D$ | $E = 1.3 \times 10^6$ mJ/m$^2$ |

The inscribed information is stable on storage at room temperature.

Examples 2–20

If a polymer having the repeating units shown hereinafter is employed in place of the polymer used in Example 1, and otherwise the same procedure is employed as described in Example 1, it is found that:

In Tables 1, 2, 3 and 4 the symbols have the following meanings:

R is the substituent corresponding to formulae 2, 3, 4, 5,
λ is the wavelength of maximum absorption,
Δn is the change in double refraction achieved in a first process,
x is the content of antenna component in the copolymer,
E is the inscribing energy, and
ε is the optical density at the inscribing wavelength of 514 nm.

Repeating units

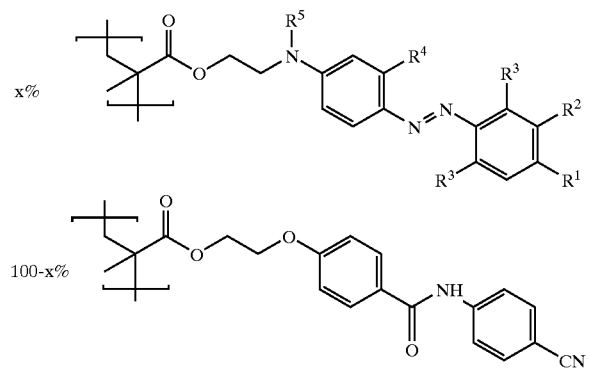

For the meaning of the values in the Tables, see Example 2:

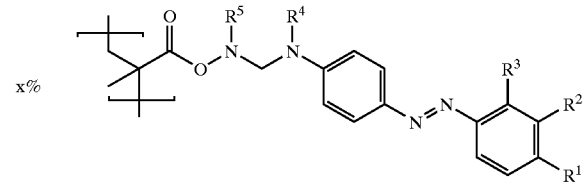

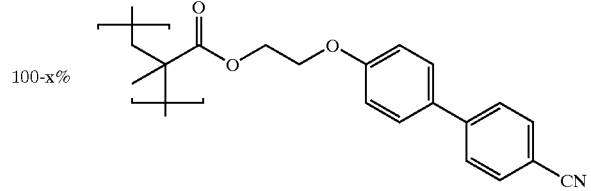

TABLE 2

|  | $R^1$ | $R^2$ | $R^3$ | $R^4$ | $R^5$ | λ | Δn | x | E | ε |
|---|---|---|---|---|---|---|---|---|---|---|
| 21 | CN | H | H | Me | H | 439 | 0.027 | 60 | 1.2 | — |
| 22 | CN | H | CN | Me | H | 502 | 0.038 | 40 | 1.4 | 3.34 |
| 23 | CN | CN | H | Me | H | 482 | 0.032 | 40 | 2.3 | 2.24 |
| 24 | CN | H | H | Et | Me | 446 | 0.023 | 40 | 2.3 | 1.7 |
| 25 | $CF_3$ | H | H | Me | H | 420 | 0.041 | 40 | 2.4 | 0.6 |
| 26 | $SO_2CF_3$ | H | H | Me | H | 460 | 0.096 | 40 | 2.5 | 1.91 |
| 27 | $OCH_3$ | H | H | Me | H | 407 | 0.034 | 40 | 3.4 | 0.2 |
| 28 | CN | H | H | Me | H | 450 | 0.029 | 40 | 4.5 | — |
| 29 | CN | H | H | Me | H | 450 | 0.024 | 40 | 4.8 | — |
| 30 | $OCH_3$ | H | H | Me | H | 412 | 0.014 | 60 | 6.6 | 0.18 |

TABLE 1

|  | $R^1$ | $R^2$ | $R^3$ | $R^{'3}$ | $R^4$ | $R^5$ | λ | Δn | x | Tg | E | ε |
|---|---|---|---|---|---|---|---|---|---|---|---|---|
| 2 | CN | CN | H | H | $CH_3$ | Et | 490 | 0.043 | 50 | 142 | 1.3 | 3.36 |
| 3 | CN | H | H | H | H | Me | 472 | 0.029 | 45 | 141 | 1.6 | 3.19 |
| 4 | CN | H | CN | H | H | Me | 490 | 0.077 | 50 | 144 | 1.8 | 2.5 |
| 5 | $NO_2$ | H | Cl | H | H | Me | 490 | 0.057 | 49 | 129 | 1.9 | 1.8 |
| 6 | $NO_2$ | H | H | H | H | Et | 484 | 0.060 | 48.5 | 124 | 2 | 1.76 |
| 7 | $NO_2$ | H | H | H | H | Me | 469 | 0.116 | 44 | 136 | 2.1 | 3 |
| 8 | $NO_2$ | H | H | H | H | Et | 502 | 0.022 | 50 | 131 | 2.3 | 3.4 |
| 9 | $CH_3$ | H | CN | CN | H | Me | 483 | 0.029 | 51 | 130 | 2.4 | 3.38 |
| 10 | CN | H | H | H | H | Me | 436 | 0.074 | 58 | 138 | 2.7 | 2.13 |
| 11 | CN | H | H | H | $CH_3$ | Et | 488 | 0.03 | 50 | 134 | 2.8 | 3.43 |
| 12 | $OCH_3$ | H | H | H | H | Me | 403 | 0.048 | 75 | 118 | 3.6 | 0.24 |
| 13 | Cl | H | H | H | H | Me | 412 | 0.042 | 60 | 99 | 3.7 | 0.52 |
| 14 | CN | H | H | H | H | Me | 452 | 0.057 | 75 | 133 | 4.1 | 1.75 |
| 15 | Br | H | H | H | H | Me | 416 | 0.016 | 52 | 137 | 4.2 | 1.51 |
| 16 | $CH_3$ | H | H | H | H | Me | 408 | 0.05 | 40 | 133 | 4.3 | 0.57 |
| 17 | $OCH_3$ | H | Cl | H | H | Me | 414 | 0.032 | 50 | 133 | 4.3 | 0.3 |
| 18 | $OCH_3$ | H | H | H | H | Me | 407 | 0.079 | 45 | 128 | 4.5 | 0.2 |
| 19 | $OCH_3$ | H | H | H | H | Me | 406 | 0.041 | 60 | 123 | 4.5 | 0.24 |
| 20 | $OCH_3$ | H | H | H | H | Me | 410 | 0.028 | 28 | 132 | 5.7 | 0.19 |

Examples 21–30

If a polymer having the repeating units shown hereinbelow is used in place of the polymer employed in Example 1 and otherwise the same procedure is employed as described in Example 1, it is found that:

Examples 31 and 32

If a homopolymer having the repeating units shown hereinbelow is used in place of the polymer employed in Example 1 and otherwise the same procedure is employed as described in Example 1, it is found that:

For the meaning of the values in the Tables, see Example 2:

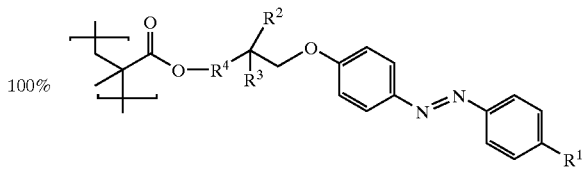

TABLE 3

| | $R^1$ | $R^2$ | $R^3$ | $R^4$ | λ | n | x | E | ε |
|---|---|---|---|---|---|---|---|---|---|
| 31 | CN | Me | H | — | 365 | 0.055 | 100 | 3.5 | 0.2 |
| 32 | CN | Me | Me | $CH_2$ | 365 | 0.042 | 100 | 3.8 | 0.2 |

Examples 33–36

If a polymer having the repeating units shown below is used in place of the polymer employed in Example 1 and otherwise the same procedure is employed as described in Example 1, it is found that:

For the meaning of the values in the Table, see Example 2;

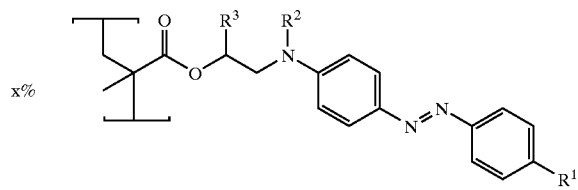

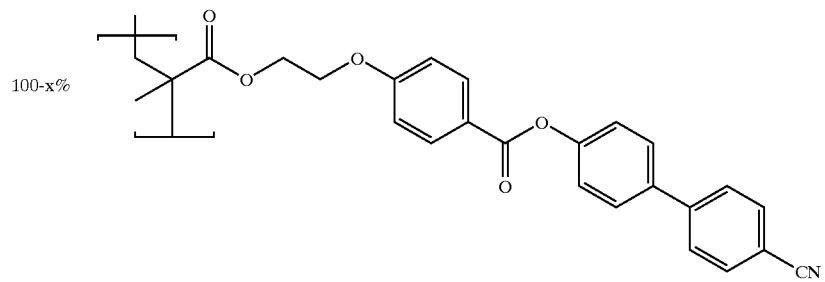

TABLE 4

| | $R^1$ | $R^2$ | $R^3$ | λ | Δn | x | E | ε |
|---|---|---|---|---|---|---|---|---|
| 33 | CN | Et | Me | 443 | 0.042 | 60 | 1.6 | 1.1 |
| 34 | CN | Et | Me | 444 | 0.039 | 50 | 1.8 | 1.1 |
| 35 | CN | Et | Me | 446 | 0.067 | 40 | 2.2 | 0.79 |
| 36 | $CF_3$ | Me | H | 420 | 0.032 | 60 | 2.2 | 0.4 |
| 37 | $CF_3$ | Me | H | 420 | 0.022 | 70 | 3.3 | 0.4 |

Example 38

A sample prepared as described in Example 1 is subjected to the following test cycle:

38.1 Pre-exposure of the sample on the light box with connected polarisation foil (exposure time: 1 hour)

38.2 Inscription with the recorder arrangement at various laser powers with polarisation of the inscribing laser at right angles to the polarisation of the pre-exposure 38.3 Renewed exposure of the inscribed sample on the light box with connected polarisation foil, the transmission direction of the polariser being the same as in the first pre-exposure (exposure time: 7–8 hours)

38.4 Inscription with the recorder arrangement under the same conditions as described above.

Figure 2:
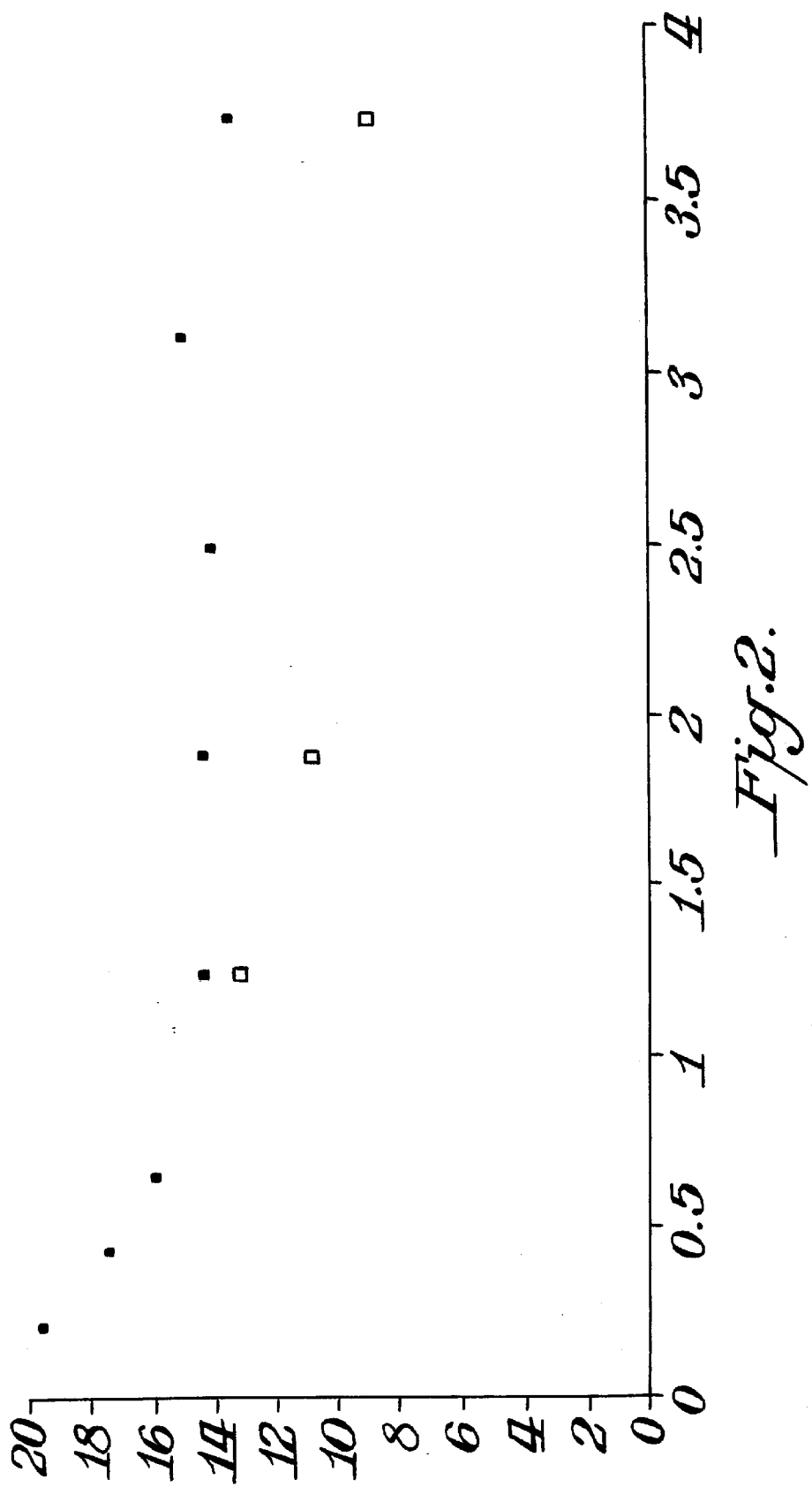

Transmission of the sample after renewed pre-exposure (see FIG. 2).

Figure 3:
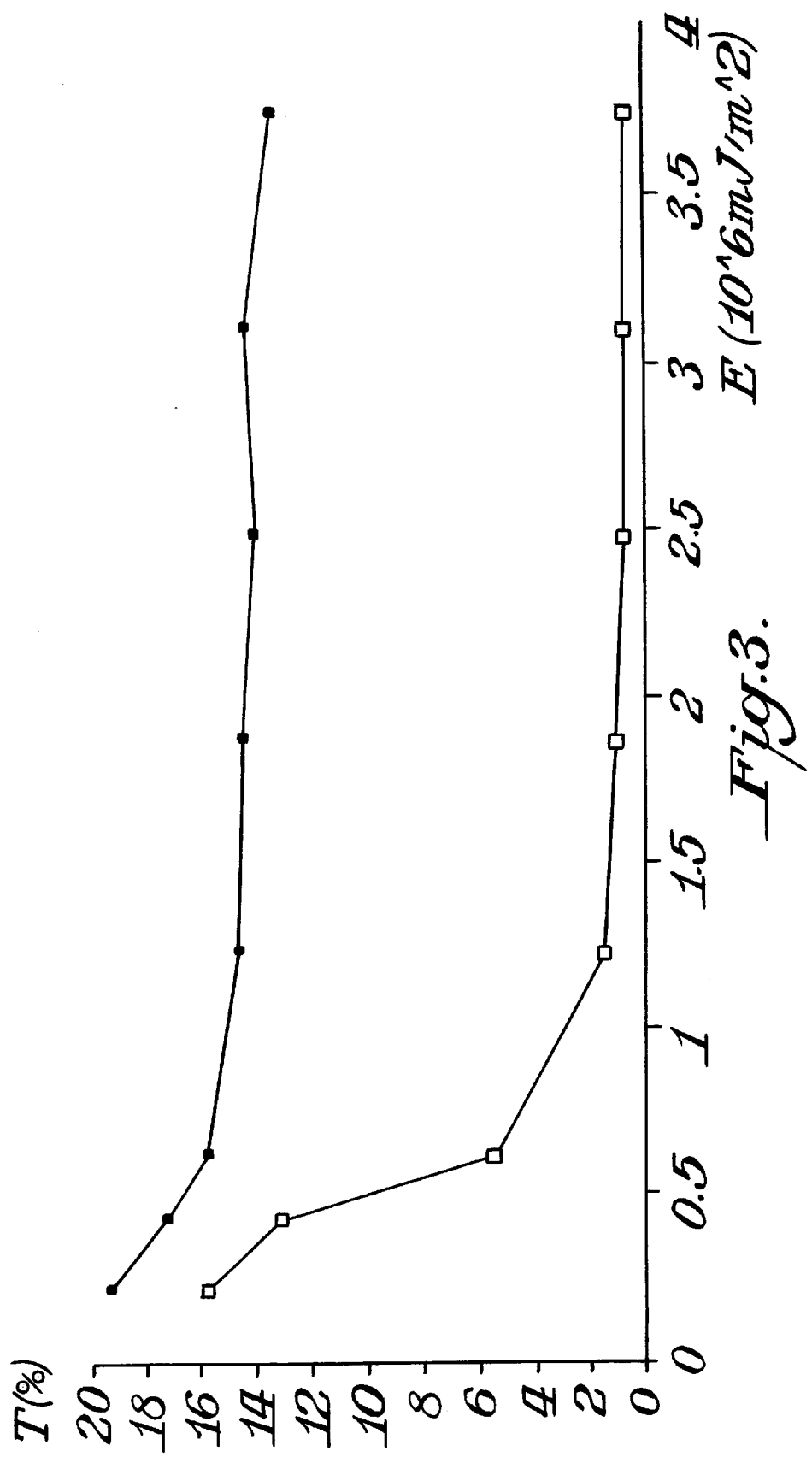

FIG. 2: Sample transmission T in [%] after renewed pre-exposure as a function of E [$10^6$ mJ/$M^2$]:

Transmission at places at which no thermal structures have been inscribed: filled rectangles Transmission at the places which the thermal structures have been produced in the inscription process: open rectangles FIG. 3: Transmission of the sample after renewed inscription in [%] as a function of E [$10^6$ mJ/$m^2$]

Immediately after the inscription: open rectangles

Initial situation after the "extinction exposure": filled rectangles (see FIG. 3)

End result:

The inscribed patterns can be completely extinguished by renewed pre-exposure at the places at which no thermal structures have been produced. Thermally inscribed structures remain however after the extinction exposure and reduce as a result of scattering the sample transmission at the corresponding places.

Figure 4:
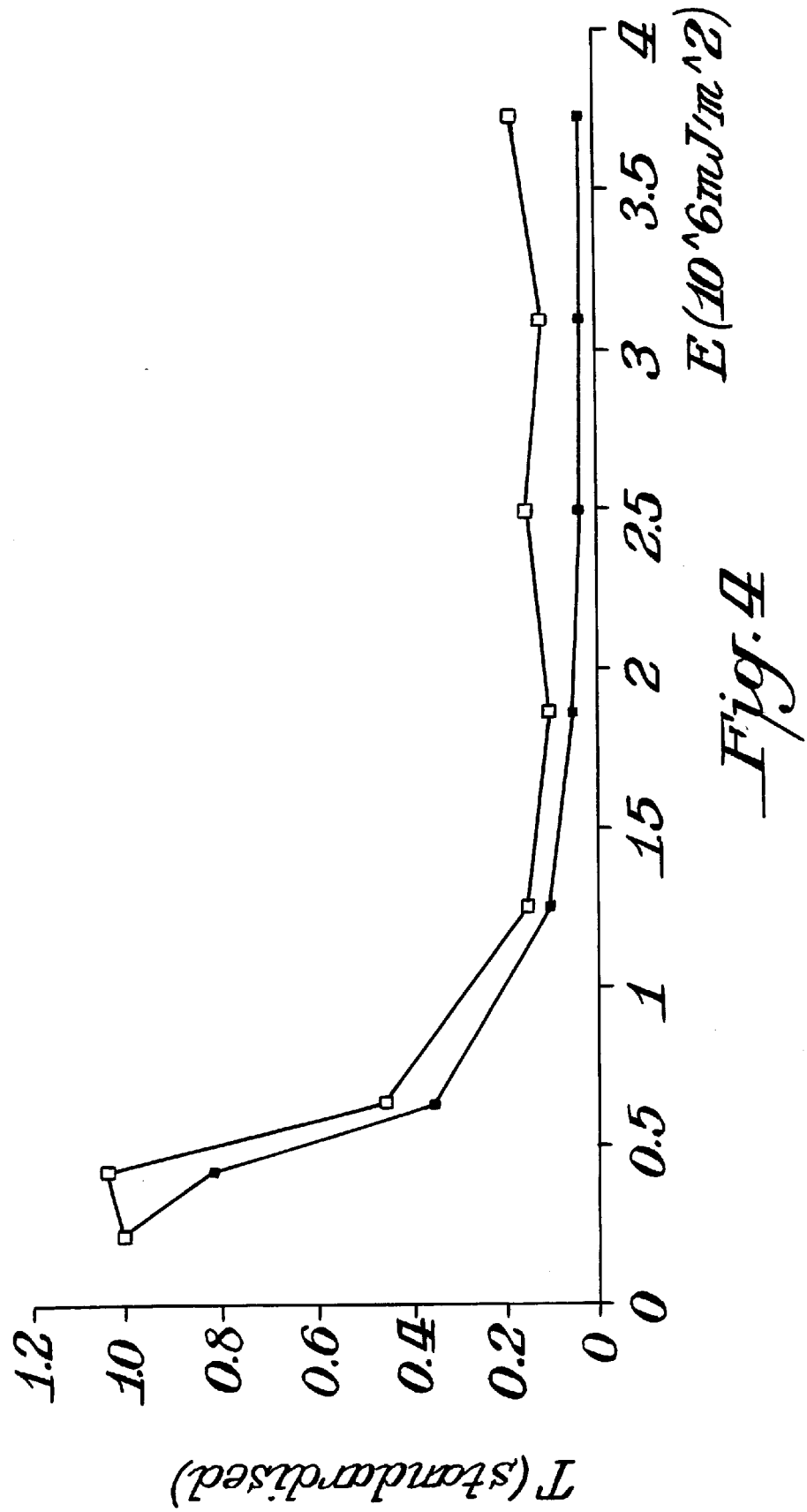

On renewed inscription the behaviour of the sample is equivalent to the original inscription test, which is illustrated by the following FIG. 4 (see FIG. 4).

FIG. 4: Standardised sample transmission T[%] as a function of the inscription energy E [$10^6$ mJ/$m^2$]

After the first inscription: filled rectangles

After the second inscription: open rectangles

Example 39

Two samples produced as in Example 1 but from a polymer having repeating units of the formulae

Figure 5:
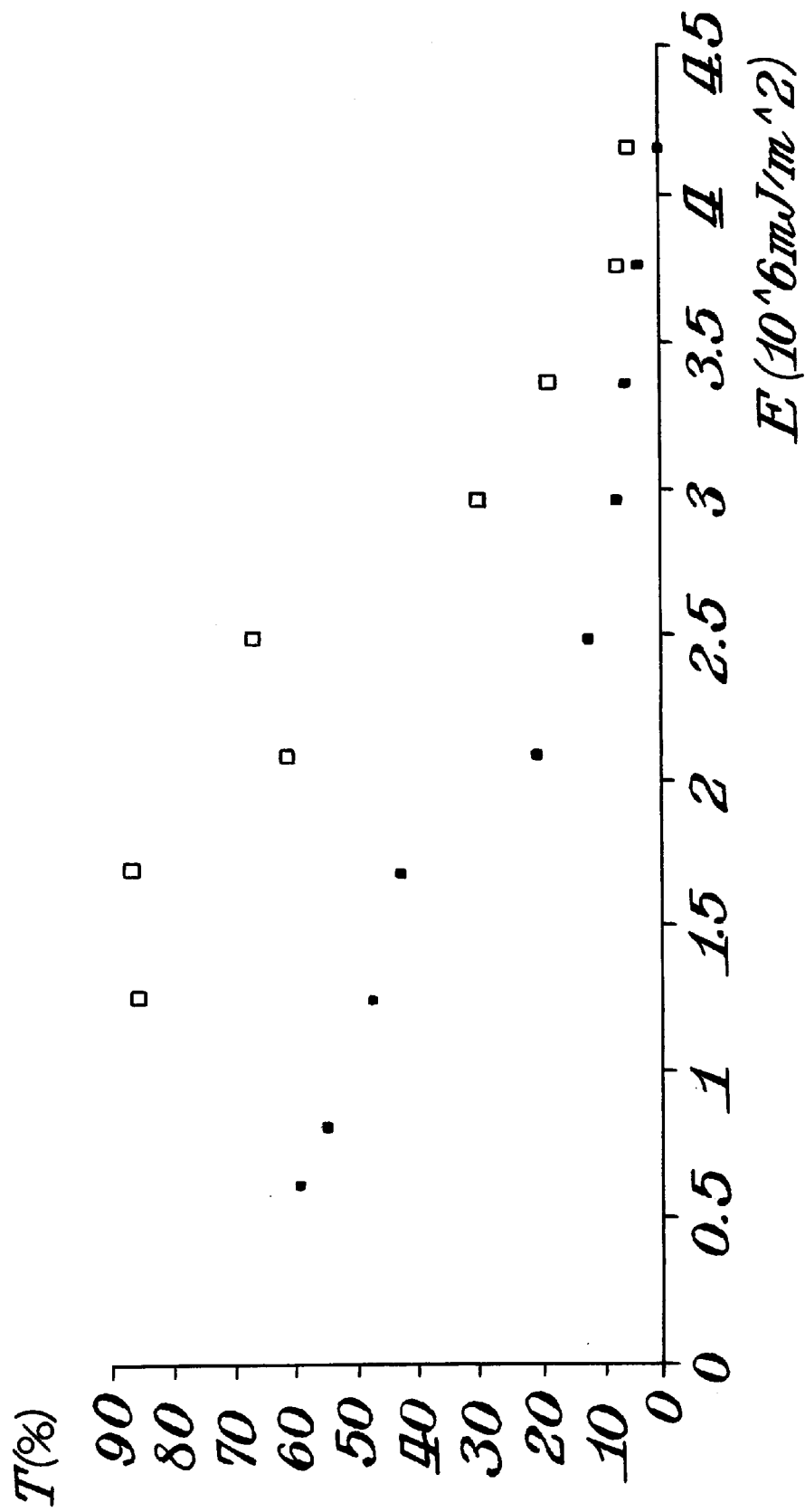

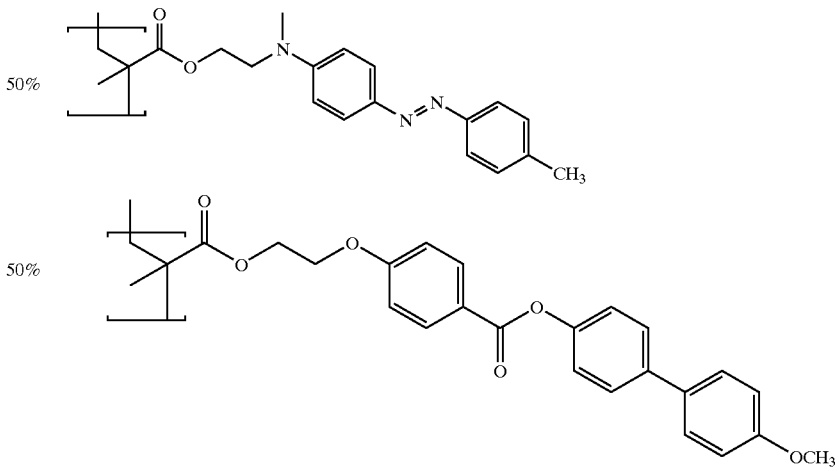

are pre-exposed as described in Example 1; more specifically one sample is pre-exposed to a transmission of 49%, and the other to a transmission of 61%. The further procedure is as described in Example 1, and the decrease in transmission in [%] with increasing inscription energy E in [$10^6$ mJ/m$^2$] is obtained as shown in the following FIG. 5 (see FIG. 5).

Measurement values from inscription test "49% transmission": filled rectangles

Measurement values from inscription test "61% transmission": open rectangles

Example 40

Preparation of the Polymers
1.1 Preparation of the Monomers
  1.1.1 From Methacrylic Chloride 100 g of N-methyl-N-(2-hydroxymethyl)-aniline are dissolved in 100 ml of chloroform. 182.6 g of triethylamine and 137.2 g of methacrylic chloride are slowly added dropwise at 40° C. while stirring, and stirring is continued at 40° C. overnight. 500 ml of chloroform are then added to the reaction solution, which is shaken with five lots of 200 ml of water. The organic phase is dried over anhydrous magnesium sulfate, copper (I) chloride is added thereto, and the organic phase is distilled in a high-vacuum after distilling off the solvent. The methacrylic ester of hydroxyethylaniline distils over as a water-clear liquid at 127–130° C./55 mbar. The yield is 49.5 g.

1.1.2 From Methacrylic Acid 50 ml of concentrated sulfuric acid are added dropwise at room temperature while stirring to a solution of 100 ml of N-methyl-N-(2-hydroxyethyl)-aniline, 265 ml of methacrylic acid and 26.5 g of hydroquinone in 398 ml of chloroform. After standing overnight the mixture is heated and the reaction water is removed by azeotropic distillation. After the solution has cooled the pH is adjusted to 7 to 8 with concentrated aqueous sodium carbonate solution, and the product is extracted from this solution by shaking with ether. The product is worked up further as described above, a yield of 56 g being obtained.

1.1.3 Monomer with the Terminal Group A 7.15 g of 2,4-dicyanoaniline are diazotised with 24 g of nitrosylsulfuric acid at 0 to 5° C. in a solution of 100 ml of glacial acetic acid, 20 ml of phosphoric acid and 7.5 ml of sulfuric acid and stirred for 1 hour. The reaction mixture is added to a solution of 15.3 g of N-methyl-N-(2-methacryloyloxyethyl)-aniline and 1.5 g of urea in 60 ml of glacial acetic acid, the temperature being kept at 10° C. After stirring briefly, the reaction mixture is adjusted to a pH of 3 with sodium carbonate solution, the precipitate is suction filtered, washed with water and dried. 14.4 g of a red solid is obtained, which can be used directly without further purification.

1.1.4 Monomer with the terminal group P 27.6 g of 4-amino-2', 4'-dicyanoazobenzene in 500 ml of dioxane are added to a solution of 33 g of 4-(2-methacryloyloxy)-ethoxybenzoic acid chloride in 100 ml of dioxane, the mixture is stirred for 2 hours, and the product is precipitated by pouring the solution into 2 l of water. The precipitate is suction filtered, dried, and purified by recrystallising it twice from dioxane. The yield is 30.4 g of orange-red crystals with a melting point of 215–217° C.

1.2 Preparation of the Copolymer 2.7 g of the monomer 1.1.3 and 5.19 g of the monomer 1.1.4 are polymerised at 70° C. in 75 ml of DMF under argon as protective gas, and with 0.39 g of azobis(isobutyronitrile) as polymerisation initiator. After 24 hours the reaction solution is filtered, the DMF is distilled off, and the residue is boiled off with methanol to remove unreacted monomer and is finally dried at 120° C. in a high vacuum. 7.18 g of an amorphous copolymer is obtained having a glass transition temperature of 144° C., the optical properties of which are specified in Example 42.5.

Further polymers can be prepared in a similar way.

Example 41

Variation of the Spacing of the Absorption Maxima

Preparation of the measurement samples: glass plates of size 2×2 cm and 1.1 mm thick are placed in a spincoater (S üss RC 5 type) and coated at 2000 revs/min for absolute tetrahydrofuran. The layer is 0.9 μm thick, transparent and amorphous. Between crossed polarisers the surface appears uniformly dark in daylight. There are no signs of polarising regions.

The small measurement plates are exposed with a Ar-ion laser with an output of 250 mW/cm$^2$ at a wavelength of 514 nm, a double refraction being obtained. The maximum achievable double refraction Δn in the polymer layer is determined in two steps:

First of all the maximum inducible path difference Δλ producing a brightening between crossed polarisers is determined by measurement with an Ehringhaus compensator. The quantitative determination is performed by compensating the brightening; this is achieved by rotating a quartz crystal placed in the beam path, which alters the optical path length and thus the path difference. The path difference at which the brightening is fully compensated is now determined. The measurement must be carried out with light of a wavelength that lies outside the absorption range of the compounds, in order to avoid resonance effects. As a rule a He-Ne laser of emission wavelength 633 nm is sufficient, and with long-wave absorptions the measurement is performed with light from a diode laser of wavelength 820 nm. The selection wavelength that is used is given in the following Tables under the column heading "λ".

In a second step the layer thickness of the polymer is measured with a mechanical layer thickness measuring device (Alphastep 200, manufactured by Tencor Instruments).

The double refraction change Δn is determined from the quotient of the path difference Δλ and the layer thickness d:

$$\Delta n = \frac{\Delta \lambda}{d}$$

The absorption maxima are determined by evaluating the UV/visual absorption spectra. With extreme mixtures it may happen that only one peak can be evaluated. In such cases the non-readable value must be substituted by the value from the corresponding 1:1-copolymer.

A similar procedure is adopted in the following examples for the preparation of the compounds and the data measurements.

The following are obtained for the case $T^1=T^2$; $Q^1 \neq Q^2$, $A \neq P$:

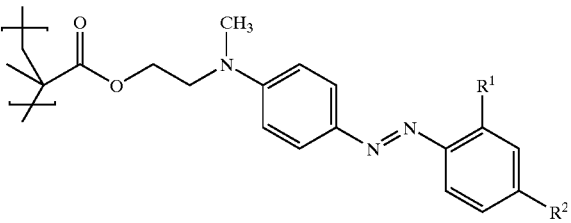

m Mole-%

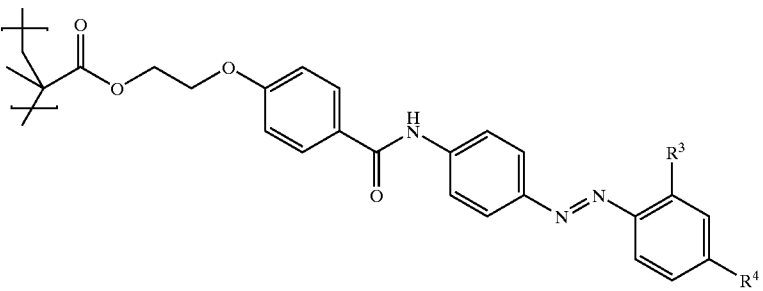

n Mole-%

Formula 2

| Example | $v_A$ | $v_P$ | $\Delta v_{P-A}$ | Δn | n | m | mW/cm² | λ [nm] |
|---|---|---|---|---|---|---|---|---|
| $R^1$ = H; $R^2$ = CN; $R^3$ = CN; $R^4$ = CN | | | | | | | | |
| 41.1 | 20900 | 25300 | 2600 | 0.110 | 70 | 30 | 250 | 820 |
| $R^1$ = CN; $R^2$ = CN; $R^3$ = H; $R^4$ = CN | | | | | | | | |
| 41.2 | 20300 | 27100 | 6800 | 0.183 | 60 | 40 | 60 | 633 |
| 41.3 | 20400 | 26700 | 6300 | 0.136 | 40 | 60 | 60 | 633 |
| $R^1$ = H; $R^2$ = NO₂; $R^3$ = H; $R^4$ = CN | | | | | | | | |
| 41.4 | 21400 | 27000 | 5600 | 0.176 | 40 | 60 | 60 | 633 |
| $R^1$ = NO₂; $R^2$ = NO₂; $R^3$ = CN; $R^4$ = CN | | | | | | | | |
| 41.5 | 19300 | 25600 | 6300 | 0.190 | 70 | 30 | 250 | 820 |
| $R^1$ = NO₂; $R^2$ = NO₂; $R^3$ = H; $R^4$ = NO₂ | | | | | | | | |
| 41.6 | 18000 | 26700 | 8700 | 0.106 | 70 | 30 | 250 | 820 |

-continued
m Mole-% 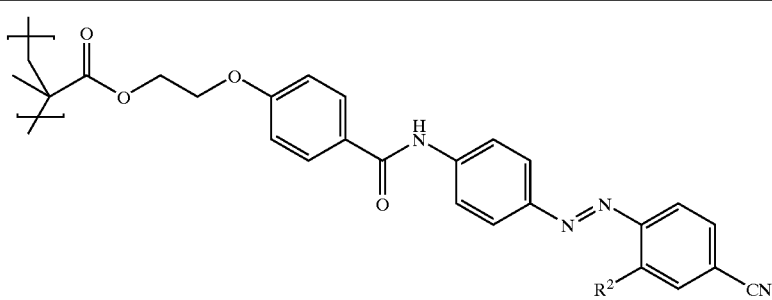
n Mole-% 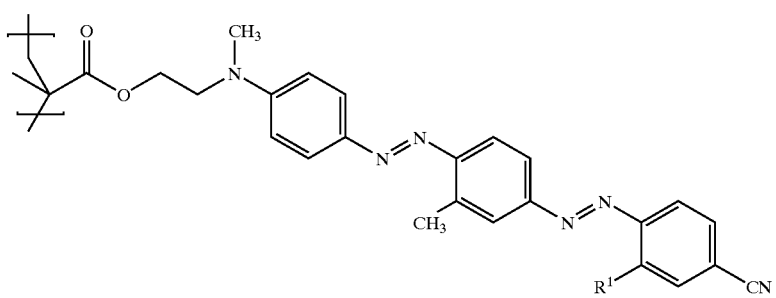
Formula 3
| Example | $v_A$ | $v_P$ | $\Delta v_{P-A}$ | $\Delta n$ | m | n | mW/cm$^2$ | λ [nm] |
|---|---|---|---|---|---|---|---|---|
| $R^1 = R^2 = H$ | | | | | | | | |
| 41.7 | 19400 | 27900 | 8300 | 0.197 | 50 | 50 | 250 | 820 |
| $R^1 = H; R^2 = CN$ | | | | | | | | |
| 41.8 | 20000 | 25400 | 5400 | 0.287 | 70 | 30 | 250 | 820 |
| $R^1 = CN; R^2 = CN$ | | | | | | | | |
| 41.9 | 19000 | 25900 | 6900 | 0.295 | 60 | 40 | 250 | 820 |
| $R^1 = CN; R^2 = H$ | | | | | | | | |
| 41.10 | 19000 | 27400 | 8200 | 0.318 | 40 | 60 | 250 | 820 |
m Mole-% 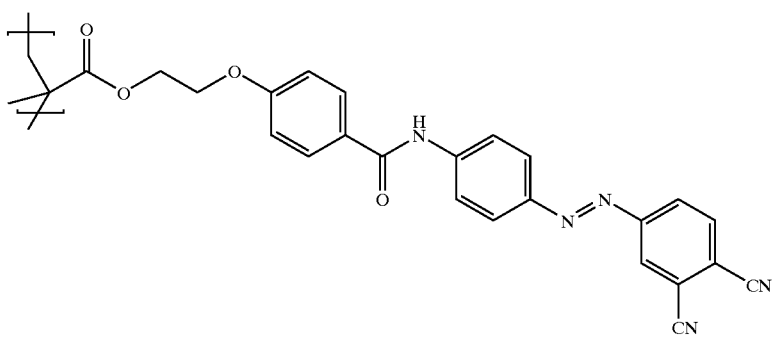
n Mole-% 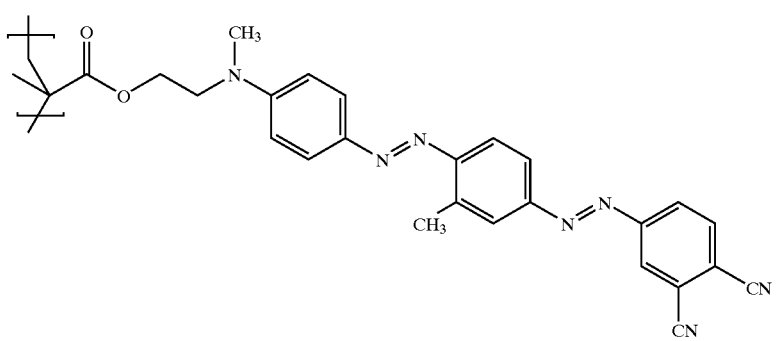

-continued
Formula 4
| Example | $v_A$ | $v_P$ | $\Delta v_{P-A}$ | $\Delta n$ | m | n | mW/cm$^2$ | $\lambda$ [nm] |
|---|---|---|---|---|---|---|---|---|
| 41.11 | 19200 | 27800 | 8600 | 0.148 | 50 | 50 | 250 | 820 |
Formula 5
n Mole-%
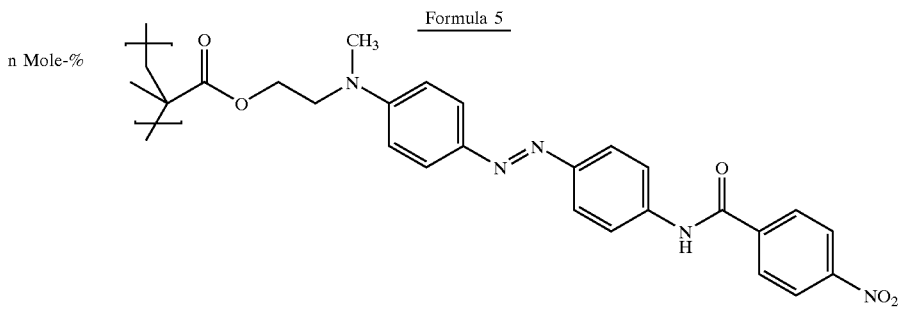
m Mole-%
| Example | $v_A$ | $v_P$ | $\Delta v_{P-A}$ | $\Delta n$ | m | n | mW/cm$^2$ | $\lambda$ [nm] |
|---|---|---|---|---|---|---|---|---|
| 41.12 | 20700 | 26000 | 5300 | 0.120 | 50 | 50 | 250 | 820 |
m Mole-%
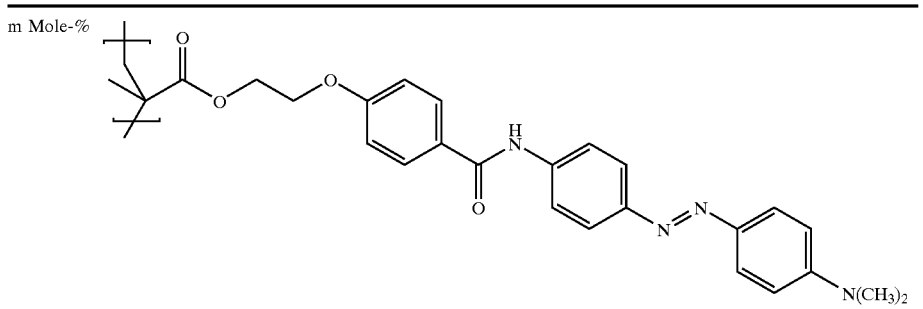
n Mole-%
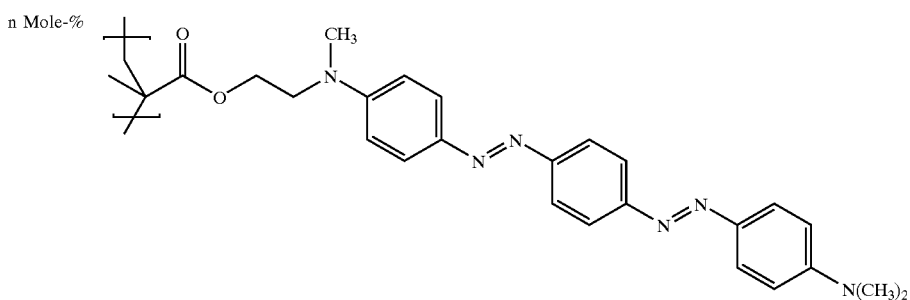
Formula 6
| Example | $v_A$ | $v_P$ | $\Delta v_{P-A}$ | $\Delta n$ | m | n | mW/cm$^2$ | $\lambda$ [nm] |
|---|---|---|---|---|---|---|---|---|
| 41.13 | 18900 | 23400 | 4500 | 0.250 | 50 | 50 | 250 | 820 |

Example 42

$T^1 = T^2; Q^1 \neq Q^2, A = P$

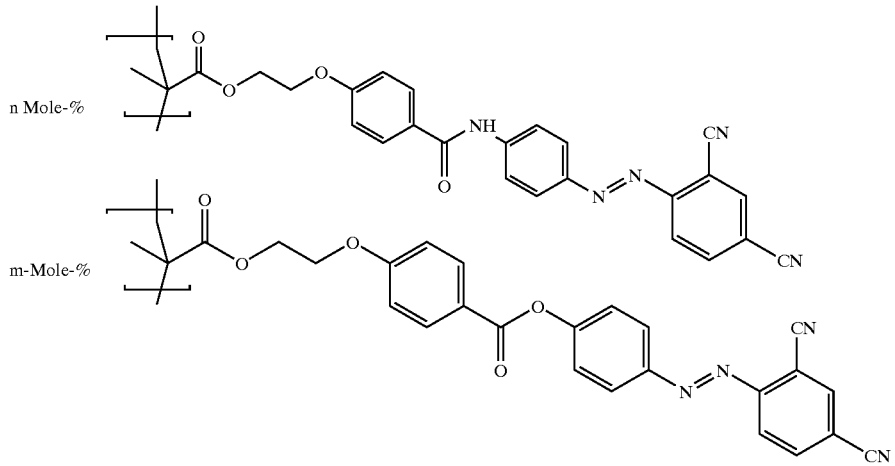

Formula 7

A copolymer of the formula 7 is prepared in a similar manner to Example 1 and a sample is made and measurements are carried out corresponding to Example 2. A double refraction change Δn is obtained, which is inscribed at 488 nm as follows:

| Example | $v_A$ | $v_P$ | $\Delta v_{P-A}$ | Δn | m | n | mW/cm² | λ [nm] |
|---|---|---|---|---|---|---|---|---|
| 42.1 | 25000 | 28000 | 3000 | 0.232 | 50 | 50 | 250 | 633 |

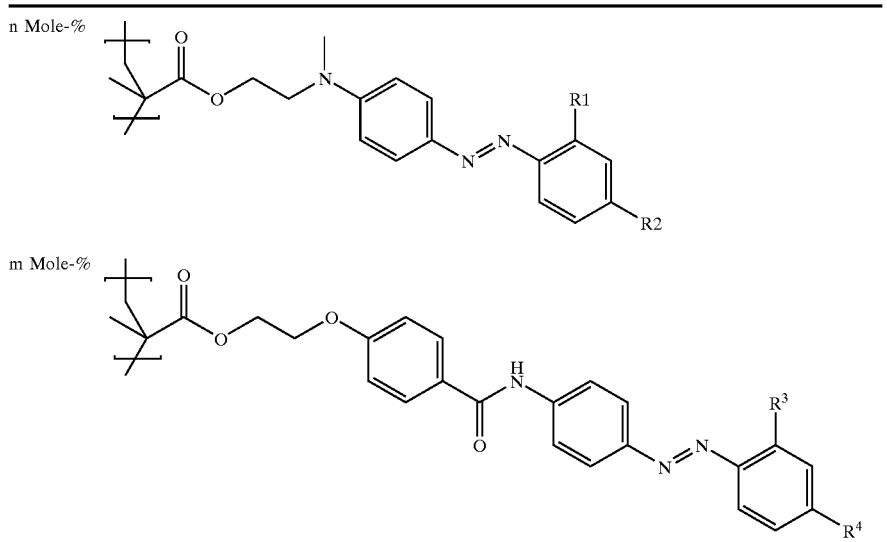

Formula 8

| Example | $v_A$ | $v_P$ | $\Delta v_{P-A}$ | Δn | m | n | mW/cm² | λ [nm] |
|---|---|---|---|---|---|---|---|---|
| $R^1 = R^2 = R^3 = R^4 = CN$ | | | | | | | | |
| 42.2 | 20400 | 25800 | 5400 | 0.175 | 90 | 10 | 120 | 633 |
| 42.3 | 20400 | 25400 | 5000 | 0.231 | 80 | 20 | 60 | 633 |
| 42.4 | 20400 | 25300 | 4900 | 0.414 | 70 | 30 | 60 | 633 |
| 42.5 | 20400 | 25000 | 4600 | 0.158 | 60 | 40 | 120 | 633 |
| $R^1 = R^3 = H; R^2 = R^4 = NO_2$ | | | | | | | | |
| 42.6 | 19200 | 26700 | 7500 | 0.171 | 70 | 30 | 250 | 820 |
| 42.7 | 19800 | 25600 | 5800 | 0.145 | 50 | 50 | 250 | 820 |
| 42.8 | 21300 | 25000 | 2700 | 0.116 | 30 | 30 | 250 | 820 |

Example 43
$T^1 \neq T^2$; $Q^1 = Q^2$, $A = P$
A copolymer of the formula
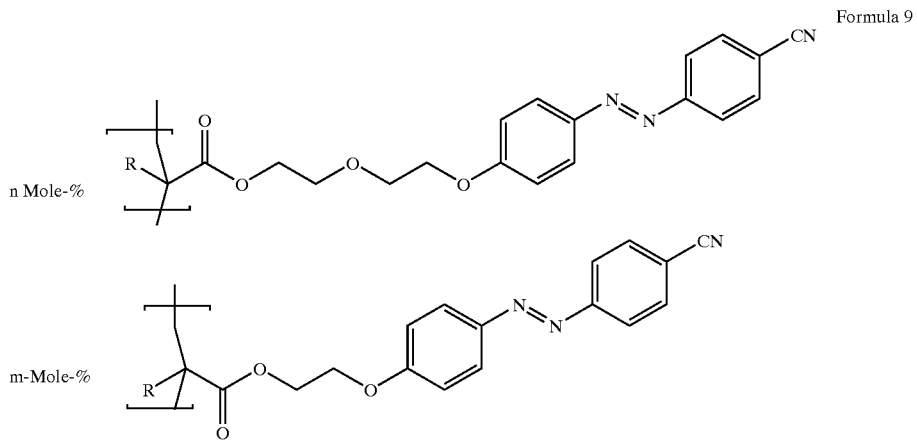
Formula 9
is prepared in a similar manner to Example 1.
| Example | $v_A$ | $v_P$ | $\Delta v_{P-A}$ | $\Delta n$ | m | n | mW/cm² | λ[nm] |
|---|---|---|---|---|---|---|---|---|
| R = CH₃ | | | | | | | | |
| 43.1 | 27 000 | 27 400 | 400 | 0.103 | 60 | 40 | 200 | 633 |
| R = H | | | | | | | | |
| 43.2 | 27 600 | 28 300 | 500 | 0.104 | 60 | 40 | 200 | 633 |
Example 44
$T^1 = T^2$; $Q^1 = Q^2$, $A \neq P$
| Example | $v_A$ | $v_P$ | $\Delta v_{P-A}$ | $\Delta n$ | m | n | mW/cm² | λ[nm] |
|---|---|---|---|---|---|---|---|---|
| 44.1 | 21600 | 23400 | 1800 | 0.211 | 50 | 50 | 60 | 633 |

Example 45

Heat Stability

Glass plates of size 2×2 cm are coated as described in Example 1 with a polymer according to Example 3.3, and 11 fields (flat fields) are inscribed so as to produce a series of increasing transmission between circa. 0 and 82% with approximately equal spacing. The transmission is measured immediately after the inscription, and defines the initial state. This sample is left blacked out without further protection for 2 months at room temperature. Following this a further one of these plates is stored in each case for 24 hours at 60° C., 80° C. and 120° C. in a drying cabinet, and the transmission is re-measured. Four series of values are thus obtained, which are compared with the initial state. The values for the transmission are given in the following Table 5:

TABLE 1

| Initial state | 2 months/ 20° C. | 24 h/ 60° C. | 24 h/ 80° C. | 24 h/ 120° C. |
|---|---|---|---|---|
| 82 | 75.4 | 68.9 | 83.6 | 72.2 |
| 73.8 | 67.2 | 65.6 | 75.4 | 68.9 |
| 65.6 | 60.7 | 59.0 | 64.0 | 54.1 |
| 50.8 | 45.9 | 52.5 | 55.8 | 49.2 |
| 54.1 | 45.9 | 52.5 | 55.8 | 44.3 |
| 19.7 | 24.6 | 29.5 | 37.7 | 19.7 |
| 32.8 | 21.3 | 24.6 | 29.5 | 16.4 |
| 19.7 | 14.8 | 14.8 | 26.2 | 16.4 |
| 9.8 | 9.8 | 13.1 | 16.4 | 11.5 |
| 6.6 | 6.6 | 11.5 | 11.5 | 9.8 |
| 0 | 0 | 6.6 | 8.2 | 4.9 |

The first column gives the measured values for the freshly prepared sample at room temperature, while column 2 gives the same measurement after 2 months' storage time. The remaining columns correspond to the measurement series after storage at the temperatures specified in the first line. If the values from columns 2 to 5 are plotted against those in column 1, a straight line of gradient 1 is obtained. The grey stages thus do not change under the effect of elevated temperature.

What is claimed is:

1. A process for storing optically avaiable information comprising:

providing a flat material comprising a photo-addressable polymer having an optical anisotropy $\Delta n$ from 0.001 to 0.95, and irradiating with light for $10^{-5}$ to $10^{-15}$ seconds to vary the optical anisotropy in a partial, selective manner.

2. The process according to claim 1, wherein the energy density of the light is between $10^3$ to $10^7$ mJ/m$^2$.

* * * * *